United States Patent
Inoue et al.

(10) Patent No.: US 9,685,485 B2
(45) Date of Patent: Jun. 20, 2017

(54) ORGANIC ELECTROLUMINESCENT DEVICE AND MANUFACTURING METHOD THEREFOR

(71) Applicant: Sharp Kabushiki Kaisha, Osaka-shi, Osaka (JP)

(72) Inventors: Satoshi Inoue, Osaka (JP); Katsuhiro Kikuchi, Osaka (JP); Shinichi Kawato, Osaka (JP); Takashi Ochi, Osaka (JP); Yuhki Kobayashi, Osaka (JP); Kazuki Matsunaga, Osaka (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 15/101,528

(22) PCT Filed: Nov. 26, 2014

(86) PCT No.: PCT/JP2014/081162
§ 371 (c)(1),
(2) Date: Jun. 3, 2016

(87) PCT Pub. No.: WO2015/083586
PCT Pub. Date: Jun. 11, 2015

(65) Prior Publication Data
US 2016/0358980 A1    Dec. 8, 2016

(30) Foreign Application Priority Data

Dec. 4, 2013 (JP) .................................. 2013-251275

(51) Int. Cl.
*H01L 27/32* (2006.01)
*H01L 51/50* (2006.01)
*H05B 33/14* (2006.01)

(52) U.S. Cl.
CPC ...... *H01L 27/3211* (2013.01); *H01L 27/3246* (2013.01); *H01L 51/5012* (2013.01); *H01L 51/5024* (2013.01); *H05B 33/145* (2013.01)

(58) Field of Classification Search
CPC ............ H01L 27/3211; H01L 27/3246; H01L 51/5012; H01L 51/5024; H05B 33/145
See application file for complete search history.

(56) References Cited

U.S. PATENT DOCUMENTS

2005/0112404 A1    5/2005    Hamada et al.
2006/0033425 A1    2/2006    Miura et al.
(Continued)

FOREIGN PATENT DOCUMENTS

JP    2004-134101 A    4/2004
JP    2005-108727 A    4/2005
(Continued)

OTHER PUBLICATIONS

Official Communication issued in International Patent Application No. PCT/JP2014/081162, mailed on Mar. 3, 2015.

*Primary Examiner* — Roy Potter
(74) *Attorney, Agent, or Firm* — Keating & Bennett, LLP

(57) ABSTRACT

An organic EL device includes a substrate and a plurality of organic EL elements disposed on the substrate. Each of the plurality of organic EL elements includes a light-emitting layer containing a light-emitting material. One of the plurality of organic EL elements includes a first film containing the same light-emitting material as the light-emitting layer of another one of the plurality of organic EL elements, the first film being in contact with an upper surface of the light-emitting layer of the one of the plurality of organic EL elements. The one of the plurality of organic EL elements does not include a second film containing the same light-emitting material as the light-emitting layer of another one of the plurality of organic EL elements, the second film (Continued)

being in contact with a lower surface of the light-emitting layer of the one of the plurality of organic EL elements.

19 Claims, 14 Drawing Sheets

(56) References Cited

U.S. PATENT DOCUMENTS

2011/0198598 A1* 8/2011 Kim .................. H01L 27/3246
        257/59
2013/0105775 A1   5/2013 Takaya

FOREIGN PATENT DOCUMENTS

JP    2011-159502 A    8/2011
JP    2013-118173 A    6/2013

* cited by examiner

ORGANIC ELECTROLUMINESCENT DEVICE AND MANUFACTURING METHOD THEREFOR

TECHNICAL FIELD

The present disclosure relates to an organic electroluminescent device (hereinafter referred to also as an organic EL device) and to a manufacturing method therefor. More particularly, the present disclosure relates to an organic EL device suitable for a large flat panel display and to a manufacturing method therefor.

BACKGROUND ART

In recent years, flat panel displays are used for various products and fields, and there is a need for flat panel displays further increased in size, improved in image quality, and having lower power consumption.

Under such circumstances, organic EL devices including organic electroluminescent elements (hereinafter referred to also as organic EL elements) that utilize electroluminescence of organic materials are attracting increasing attention as display units for all-solid state flat panel displays having excellent features such as capability of low voltage operation, fast responsiveness, and self-light emission.

An organic EL device includes, for example, a substrate such as a glass substrate, thin film transistors (TFTs) disposed on the substrate, and organic EL elements connected to the TFTs. Each of the organic EL elements has a structure in which a first electrode an organic electroluminescent layer (hereinafter referred to also as an organic EL layer), and a second electrode are stacked in this order. The first electrode is connected to a TFT. The organic EL layer has a structure in which layers such as a hole injection layer, a hole transport layer, an electron blocking layer, a light-emitting layer, a hole blocking layer, an electron transport layer, and an electron injection layer are stack.

An organic EL device for a full-color display generally includes organic EL elements of three colors, i.e., red (R), green (G), and blue (B), as sub-pixels. These sub-pixels are arranged in a matrix form to form pixels each composed of three color sub-pixels. These organic EL elements are caused to emit light from desired luminances in a selective manner to display an image.

For example, in a previously disclosed multi-color light-emitting element, a plurality of organic EL elements each having an organic compound layer including a light-emitting layer are disposed between a reflecting electrode and a transparent electrode. The plurality of organic EL elements include those with at least two different light-emission spectra, and light-emitting regions of the organic EL elements with different light-emission spectra are positioned at different positions in a thickness direction within the light-emitting layers according to the different light-emission spectra (see, for example, PTL 1).

PTL 1 discloses a method in which only a given region in each light-emitting layer is doped with a light-emitting guest material. This method is described in [0049] in PTL 1.

To produce the above-described organic EL device, light-emitting materials are formed into patterns of the light-emitting layers that correspond to the organic EL elements (sub-pixels) with different colors.

The following methods have been proposed to form the patterns of the light-emitting layers. In one method, a vapor deposition mask substantially equal in size to a substrate is brought into contact with the substrate, and then vapor deposition is performed (this method may be hereinafter referred to as a contact deposition method). In another method, a vapor deposition mask smaller in size than a substrate is used, and vapor deposition is performed over the entire substrate while the substrate is moved relative to the mask and an evaporation source (this method may be hereinafter referred to as a gap deposition method).

CITATION LIST

Patent Literature

PTL 1: Japanese Unexamined Patent Application Publication No. 2004-134101

SUMMARY OF INVENTION

Technical Problem

However, when light is emitted from an organic EL device including organic EL elements with color-patterned light-emitting layers formed by the gap deposition method, a color mixing phenomenon in which an additional color is mixed into an intended light-emitting color in some cases, and this causes a reduction in color purity.

An enlarged photograph of an organic EL device the present inventors have studied is shown in the upper portion of FIG. 27, and a schematic cross-sectional view of the organic EL device shown in the upper portion is shown in the lower portion of FIG. 27.

As shown in the upper portion of FIG. 27, this organic EL device includes red, green, and blue organic EL elements 120R, 120G, and 120B separated by light-shielding portions 180. In the state shown in the upper portion of FIG. 27, only the red organic EL elements 120R are turned on, but it can be seen that their light-emitting regions spread to regions of other elements. This may be because of the following reason. As shown in the lower portion of FIG. 27, vapor deposition particles fly also to light-emitting layer regions other than prescribed light-emitting layer regions. In each of the light-emitting layers, light-emitting materials of other light-emitting layers adhere to the upper and/or lower side, and unnecessary patterns are thereby formed.

This phenomenon may partially occur when the contact deposition method in which a vapor deposition mask is brought into contact with a substrate is used to form color-patterned light-emitting layers. This may be because bending of the vapor deposition mask by its own weight, distortion of the vapor deposition mask, etc. cause a gap to be partially formed between the vapor deposition mask and the substrate.

The reason that a light-emitting material adheres to a region other than prescribed regions when a gap is present between the substrate and the vapor deposition mask as described above may be that scattering of the vapor deposition particles, re-evaporation of vapor deposition particles adhering to the vapor deposition apparatus, etc. cause the vapor deposition particles to fly toward the substrate from unexpected directions.

In PTL 1, light emission positions in the light-emitting layers are changed according to the light emission spectra. However, with this method, the influence of the unnecessary patterns described above is not always eliminated, and color mixing may occur.

The embodiment of the invention has been made in view of the foregoing circumstances, and it is an object to provide an organic electroluminescent device in which the occurrence of color mixing can be suppressed and to provide a manufacturing method for the organic electroluminescent device.

Solution to Problem

One aspect of the embodiment of the invention may be an organic electroluminescent device comprising: a substrate; and a plurality of organic electroluminescent elements disposed on the substrate;

wherein each of the plurality of organic electroluminescent elements includes a light-emitting layer containing a light-emitting material, wherein the light-emitting materials are able to emit light of different colors, wherein one of the plurality of organic electroluminescent elements (which may be referred to also as an organic electroluminescent element I) includes a first film containing the same light-emitting material as the light-emitting layer of another one of the plurality of organic electroluminescent elements, the first film being in contact with an upper surface of the light-emitting layer of the organic electroluminescent element I (this light-emitting layer may be hereinafter referred to also as a light-emitting layer i), wherein the organic electroluminescent element I does not include a second film containing the same light-emitting material as the light-emitting layer of another one of the plurality of organic electroluminescent elements, the second film being in contact with a lower surface of the light-emitting layer i of the organic electroluminescent element I, and wherein the light-emitting layer i in contact with the first film emits light from a portion spaced apart from the upper surface.

Hereinafter, this organic electroluminescent device is referred to also as an organic electroluminescent device according to a first aspect.

Preferred embodiments of the organic electroluminescent device according to the first aspect will next be described. The following preferred embodiments may be appropriately combined, and an embodiment obtained by combining at least two of the following embodiments is also a preferred embodiment.

The first film may be thinner than the light-emitting layer containing the same light-emitting material as the first film.

The first film may be thinner than the light-emitting layer i in contact with the first film.

The first film may be in contact with the entire upper surface or in contact with only part of the upper surface.

The first film comprises a plurality of the first films (e.g., two or more and three or less first films), and light-emitting materials contained in the plurality of first films may be different from each other.

The portion spaced apart from the upper surface may be a portion including the lower surface and obtained by trisecting the light-emitting layer i in its thickness direction.

The light-emitting layer i in contact with the first film may emit light from the lower surface.

The first film may be continuous with the light-emitting layer containing the same light-emitting material as the first film or may be discontinuous with this light-emitting layer.

The organic electroluminescent element I including the first film may include a first electrode and a second electrode, the first electrode, the light-emitting layer i, the first film, and the second electrode of the organic electroluminescent element I may be disposed in this order, and the light-emitting layer i in contact with the first film may be a light-emitting layer having the capability of transporting charges of the same polarity as charges injected from the second electrode.

The organic electroluminescent element I including the first film may include a first electrode, a second electrode, and a charge blocking layer, the first electrode, the charge blocking layer, the light-emitting layer i, the first film, and the second electrode of the organic electroluminescent element I may be disposed in this order, and the charge blocking layer may block charges injected from the second electrode.

The substrate may by a TFT substrate or an insulating substrate.

Another aspect of the embodiment of the invention may be an organic electroluminescent device comprising: a substrate; and a plurality of organic electroluminescent elements disposed on the substrate;

wherein each of the plurality of organic electroluminescent elements includes a light-emitting layer containing a light-emitting material, wherein the light-emitting materials are able to emit light of different colors, wherein one of the plurality of organic electroluminescent elements (hereinafter referred to also as an organic electroluminescent element II) includes a first film containing the same light-emitting material as the light-emitting layer of another one of the plurality of organic electroluminescent elements, the first film being in contact with an upper surface of the light-emitting layer of the organic electroluminescent element II (this light-emitting layer may be hereinafter referred to also as a light-emitting layer ii) and a second film containing the same light-emitting material as the light-emitting layer of another one of the plurality of organic electroluminescent elements, the second film being in contact with a lower surface of the light-emitting layer ii of the organic electroluminescent element II, and wherein the light-emitting layer ii in contact with the first film and the second film emits light from a portion spaced apart from the upper surface and the lower surface.

Hereinafter, this organic electroluminescent device is referred to also as an organic electroluminescent device according to a second aspect.

Preferred embodiments of the organic electroluminescent device according to the second aspect will next be described. The following preferred embodiments may be appropriately combined, and an embodiment obtained by combining at least two of the following preferred embodiments is also a preferred embodiment.

The first film may be thinner than the light-emitting layer containing the same light-emitting material as the first film.

The second film may be thinner than the light-emitting layer containing the same light-emitting material as the second film.

The first film and the second film may be thinner than the light-emitting layer ii in contact with the first film and the second film.

The first film may be in contact with the entire upper surface or may be in contact with only part of the upper surface.

The second film may be in contact with the entire lower surface or may be in contact with only part of the lower surface.

The light-emitting material contained in the first film may be different from the light-emitting material contained in the second film.

The first film may comprise a plurality of the first films (e.g., two or more and three or less first films), and light-emitting materials contained in the plurality of first films may be different from each other.

The second film may comprise a plurality of the second films (e.g., two or more and three or less second films), and light-emitting materials contained in the plurality of second films may be different from each other.

The portion spaced apart from the upper surface and the lower surface may be a central portion when the light-emitting layer ii is trisected in its thickness direction.

The light-emitting layer ii in contact with the first film and the second film may emit light from the center with respect to the thickness direction.

The first film may be continuous with the light-emitting layer containing the same light-emitting material as the first film or may be discontinuous with this light-emitting layer.

The second film may be continuous with the light-emitting layer containing the same light-emitting material as the second film or may be discontinuous with this light-emitting layer.

The light-emitting layer ii in contact with the first film and the second film may be a light-emitting layer having bipolar charge transport capability.

The light-emitting material of the light-emitting layer ii in contact with the first film and the second film may contain a host material having electron transport capability and an assist material having hole transport capability, and a HOMO (highest occupied molecular orbital) level of the assist material may be higher than a HOMO level of the host material.

The light-emitting material of the light-emitting layer ii in contact with the first film and the second film may contain a host material having hole transport capability and an assist material having electron transport capability, and a LUMO (lowest unoccupied molecular orbital) level of the assist material may be lower than a LUMO level of the host material.

The substrate may be a TFT substrate or an insulating substrate.

Another aspect of the embodiment of the invention may be an organic electroluminescent device comprising: a substrate; and a plurality of organic electroluminescent elements disposed on the substrate;

wherein each of the plurality of organic electroluminescent elements includes a light-emitting layer containing a light-emitting material, wherein the light-emitting materials are able to emit light of different colors, wherein one of the plurality of organic electroluminescent elements (hereinafter referred to also as an organic electroluminescent element III) includes a first film containing the same light-emitting material as the light-emitting layer of another one of the plurality of organic electroluminescent elements, the first film being in contact with a lower surface of the light-emitting layer of the organic electroluminescent element III (this light-emitting layer may be hereinafter referred to also as a light-emitting layer iii), wherein the organic electroluminescent element III does not include a second film containing the same light-emitting material as the light-emitting layer of another one of the plurality of organic electroluminescent elements, the second film being in contact with an upper surface of the light-emitting layer iii of the organic electroluminescent element III, and wherein the light-emitting layer iii in contact with the first film emits light from a portion spaced apart from the lower surface.

Hereinafter, this organic electroluminescent device is referred to also as an organic electroluminescent device according to a third aspect.

Preferred embodiments of the organic electroluminescent device according to the third aspect will next be described. The following preferred embodiments may be appropriately combined, and an embodiment obtained by combining at least two of the following preferred embodiments is also a preferred embodiment.

The first film may be thinner than the light-emitting layer containing the same light-emitting material as the first film.

The first film may be thinner than the light-emitting layer iii in contact with the first film.

The first film may be in contact with the entire lower surface or may be in contact with only part of the lower surface.

The first film may comprise a plurality of the first films (e.g., two or more and three or less first films), and light-emitting materials contained in the plurality of first films may be different from each other.

The portion spaced apart from the lower surface may be a portion including the upper surface and obtained by trisecting the light-emitting layer iii in its thickness direction.

The light-emitting layer iii in contact with the first film may emit light from the upper surface.

The first film may be continuous with the light-emitting layer containing the same light-emitting material as the first film or may be discontinuous with this light-emitting layer.

The organic electroluminescent element III including the first film may include a first electrode and a second electrode, the first electrode, the first film, the light-emitting layer iii, and the second electrode of the organic electroluminescent element III may be disposed in this order, and the light-emitting layer iii in contact with the first film may be a light-emitting layer having the capability of transporting charges of the same polarity as charges injected from the first electrode.

The organic electroluminescent element III including the first film may include a first electrode, a second electrode, and a charge blocking layer, the first electrode, the first film, the light-emitting layer iii, the charge blocking layer, and the second electrode of the organic electroluminescent element III may be disposed in this order, and the charge blocking layer may block charges injected from the first electrode.

The substrate may be a TFT substrate or an insulating substrate.

Another aspect of the embodiment of the invention may be an organic electroluminescent device comprising: a substrate; and a plurality of organic electroluminescent elements disposed on the substrate, wherein each of the plurality of organic electroluminescent elements includes a first electrode, a second electrode, and a light-emitting layer containing a light-emitting material, wherein the light-emitting materials are able to emit light of different colors, wherein one of the plurality of organic electroluminescent elements (hereinafter referred to also as an organic electroluminescent element IV) includes a first film containing the same light-emitting material as the light-emitting layer of another one of the plurality of organic electroluminescent elements, the first film being in contact with an upper surface of the light-emitting layer of the organic electroluminescent element IV (this light-emitting layer is referred to also as a light-emitting layer iv), wherein the organic electroluminescent element IV does not include a second film containing the same light-emitting material as the light-emitting layer of another one of the plurality of organic electroluminescent elements, the second film being in contact with a lower surface of the light-emitting layer iv of the organic electroluminescent element IV, wherein the first electrode, the light-emitting layer iv, the first film, and the second electrode of the organic electroluminescent element IV including the first film are disposed in this order, and wherein the light-emitting layer iv in contact with the first film is a light-emitting layer having the capability of transporting charges of the same polarity as charges injected from the second electrode.

Hereinafter, this organic electroluminescent device is referred to also as an organic electroluminescent device according to a fourth aspect.

Another aspect of the embodiment of the invention may be an organic electroluminescent device comprising: a substrate; and a plurality of organic electroluminescent elements disposed on the substrate;

wherein each of the plurality of organic electroluminescent elements includes a first electrode, a second electrode, and a light-emitting layer containing a light-emitting material, wherein the light-emitting materials are able to emit light of different colors, wherein one of the plurality of organic electroluminescent elements (hereinafter referred to also as an organic electroluminescent element V) includes a first film containing the same light-emitting material as the light-emitting layer of another one of the plurality of organic electroluminescent elements, the first film being in contact with an upper surface of the light-emitting layer of the organic electroluminescent element V (this light-emitting layer may be hereinafter referred to also as a light-emitting layer v), wherein the organic electroluminescent element V does not include a second film containing the same light-emitting material as the light-emitting layer of another one of the plurality of organic electroluminescent elements, the second film being in contact with a lower surface of the light-emitting layer v of the organic electroluminescent element V, wherein the organic electroluminescent element V including the first film further includes a charge blocking layer, wherein the first electrode, the charge blocking layer, the light-emitting layer v, the first film, and the second electrode of the organic electroluminescent element V including the first film are disposed in this order, and wherein the charge blocking layer blocks charges injected from the second electrode.

Hereinafter, this organic electroluminescent device may be referred to also as an organic electroluminescent device according to a fifth aspect.

Another aspect of the embodiment of the invention may be an organic electroluminescent device comprising: a substrate; and a plurality of organic electroluminescent elements disposed on the substrate;

wherein each of the plurality of organic electroluminescent elements includes a light-emitting layer containing a light-emitting material, wherein the light-emitting materials are able to emit light of different colors, wherein one of the plurality of organic electroluminescent elements (hereinafter referred to also as an organic electroluminescent element VI) includes a first film containing the same light-emitting material as the light-emitting layer of another one of the plurality of organic electroluminescent elements, the first film being in contact with an upper surface of the light-emitting layer of the organic electroluminescent element VI (this light-emitting layer may be hereinafter referred to also as a light-emitting layer vi) and a second film containing the same light-emitting material as the light-emitting layer of another one of the plurality of organic electroluminescent elements, the second film being in contact with a lower surface of the light-emitting layer vi of the organic electroluminescent element VI, and wherein the light-emitting layer vi in contact with the first film and the second film is a light-emitting layer having bipolar charge transport capability.

Hereinafter, this organic electroluminescent device is referred to also as an organic electroluminescent device according to a sixth aspect.

Another aspect of the embodiment of the invention may be an organic electroluminescent device comprising: a substrate; and a plurality of organic electroluminescent elements disposed on the substrate;

wherein each of the plurality of organic electroluminescent elements includes a light-emitting layer containing a light-emitting material, wherein the light-emitting materials are able to emit light of different colors, wherein one of the plurality of organic electroluminescent elements (hereinafter referred to also as an organic electroluminescent element VII) includes a first film containing the same light-emitting material as the light-emitting layer of another one of the plurality of organic electroluminescent elements, the first film being in contact with an upper surface of the light-emitting layer of the organic electroluminescent element VII (this light-emitting layer may be hereinafter referred to also as a light-emitting layer vii) and a second film containing the same light-emitting material as the light-emitting layer of another one of the plurality of organic electroluminescent elements, the second film being in contact with a lower surface of the light-emitting layer vii of the organic electroluminescent element VII, wherein the light-emitting material of the light-emitting layer vii in contact with the first film and the second film contains a host material having electron transport capability and an assist material having hole transport capability, and wherein a HOMO level of the assist material is higher than a HOMO level of the host material.

Hereinafter, this organic electroluminescent device is referred to also as an organic electroluminescent device according to a seventh aspect.

Another aspect of the embodiment of the invention may be an organic electroluminescent device comprising: a substrate; and a plurality of organic electroluminescent elements disposed on the substrate;

wherein each of the plurality of organic electroluminescent elements includes a light-emitting layer containing a light-emitting material, wherein the light-emitting materials are able to emit light of different colors, wherein one of the plurality of organic electroluminescent elements (hereinafter referred to also as an organic electroluminescent element VIII) includes a first film containing the same light-emitting material as the light-emitting layer of another one of the plurality of organic electroluminescent elements, the first film being in contact with an upper surface of the light-emitting layer of the organic electroluminescent element VIII (this light-emitting layer may be hereinafter referred to also as a light-emitting layer viii) and a second film containing the same light-emitting material as the light-emitting layer of another one of the plurality of organic electroluminescent elements, the second film being in contact with a lower surface of the light-emitting layer viii of the organic electroluminescent element VIII, wherein the light-emitting material of the light-emitting layer viii in contact with the first film and the second film contains a host material having hole transport capability and an assist material having electron transport capability, and wherein a LUMO level of the assist material is lower than a LUMO level of the host material.

Hereinafter, this organic electroluminescent device is referred to also as an organic electroluminescent device according to an eighth aspect.

Another aspect of the embodiment of the invention may be an organic electroluminescent device comprising: a substrate; and a plurality of organic electroluminescent elements disposed on the substrate;

wherein each of the plurality of organic electroluminescent elements includes a first electrode, a second electrode, and a light-emitting layer containing a light-emitting material, wherein the light-emitting materials are able to emit light of different colors, wherein one of the plurality of organic electroluminescent elements (hereinafter referred to also as an organic electroluminescent element IX) includes a first film containing the same light-emitting material as the light-emitting layer of another one of the plurality of organic electroluminescent elements, the first film being in contact with a lower surface of the light-emitting layer of the organic electroluminescent element IX (this light-emitting layer may be hereinafter referred to also as a light-emitting layer ix)

wherein the organic electroluminescent element IX does not include a second film containing the same light-emitting material as the light-emitting layer of another one of the plurality of organic electroluminescent elements, the second film being in contact with an upper surface of the light-emitting layer ix of the organic electroluminescent element IX, wherein the first electrode, the first film, the light-emitting layer ix, and the second electrode of the organic electroluminescent element IX including the first film are disposed in this order, and wherein the light-emitting layer ix in contact with the first film is a light-emitting layer having the capability of transporting charges of the same polarity as charges injected from the first electrode.

Hereinafter, this organic electroluminescent device is referred to also as an organic electroluminescent device according to a ninth aspect.

Another aspect of the embodiment of the invention may be an organic electroluminescent device comprising: a substrate; and a plurality of organic electroluminescent elements disposed on the substrate;

wherein each of the plurality of organic electroluminescent elements includes a first electrode, a second electrode, and a light-emitting layer containing a light-emitting material, wherein the light-emitting materials are able to emit light of different colors, wherein one of the plurality of organic electroluminescent elements (hereinafter referred to as an organic electroluminescent element X) includes a first film containing the same light-emitting material as the light-emitting layer of another one of the plurality of organic electroluminescent elements, the first film being in contact with a lower surface of the light-emitting layer of the organic electroluminescent element X (this light-emitting layer is referred to also as a light-emitting layer x), wherein the organic electroluminescent element X does not include a second film containing the same light-emitting material as the light-emitting layer of another one of the plurality of organic electroluminescent elements, the second film being in contact with an upper surface of the light-emitting layer x of the organic electroluminescent element X, wherein the organic electroluminescent element X including the first film further includes a charge blocking layer, wherein the first electrode, the first film, the light-emitting layer x, the charge blocking layer, and the second electrode of the organic electroluminescent element X including the first film are disposed in this order, and wherein the charge blocking layer blocks charges injected from the first electrode.

Hereinafter, this organic electroluminescent device is referred to also as an organic electroluminescent device according to a tenth aspect.

Another aspect of the embodiment of the invention may be an organic electroluminescent device comprising: a substrate; and a plurality of organic electroluminescent elements disposed on the substrate;

wherein each of the plurality of organic electroluminescent elements includes a light-emitting layer, wherein the light-emitting layers emit light of different colors and are adjacent to each other, wherein each of the plurality of light-emitting layers overlaps at least partially a light-emitting layer emitting light of a different color, wherein, among the plurality of light-emitting layers overlapping each other, at least one lower light-emitting layer contains a light-emitting material having electron transport capability, and wherein, among the plurality of light-emitting layers overlapping each other, at least one upper light-emitting layer contains a light-emitting material having hole transport capability.

Hereinafter, this organic electroluminescent device is referred to also as an organic electroluminescent device according to an eleventh aspect.

Another aspect of the embodiment of the invention may be an organic electroluminescent device comprising: a substrate; and a plurality of organic electroluminescent elements disposed on the substrate;

wherein each of the plurality of organic electroluminescent elements includes a light-emitting layer, wherein the light-emitting layers emit light of different colors and are adjacent to each other, wherein each of the plurality of light-emitting layers overlaps at least partially a light-emitting layer emitting light of a different color, wherein an electron blocking layer is disposed below a lower surface of at least one lower light-emitting layer among the plurality of light-emitting layers overlapping each other, and wherein a hole blocking layer is disposed above an upper surface of at least one upper light-emitting layer among the plurality of light-emitting layers overlapping each other.

Hereinafter, this organic electroluminescent device is referred to also as an organic electroluminescent device according to a twelfth aspect.

The organic electroluminescent devices according to the first to twelfth aspects may be appropriately combined, and such aspects are also included in the embodiment of the invention.

For example, the organic electroluminescent devices according to the first to third aspects may be combined to each other. Specifically, another aspect of the embodiment of the invention may be an organic electroluminescent device comprising: a substrate; and first, second, and third organic electroluminescent elements disposed on the substrate;

wherein the first, second, and third organic electroluminescent elements include first, second, and third light-emitting layers, respectively, wherein the first, second, and third light-emitting layers include first, second, and third light-emitting materials, respectively, wherein the first, second, and third light-emitting materials are able to emit light of mutually different colors, wherein the first organic electroluminescent element includes a first film containing the same light-emitting material as the second or third light-emitting material, the first film being in contact with an upper surface of the first light-emitting layer, wherein the first organic electroluminescent element does not include a second film containing the same light-emitting material as the second or third light-emitting material, the second film being in contact with a lower surface of the first light-emitting layer, wherein the first light-emitting layer emits light from a portion spaced apart from the upper surface in contact with the first film, wherein the second organic electroluminescent element includes a third film containing the same light-emitting material as the first or third light-emitting material, the third film being in contact with an upper surface of the second light-emitting layer and a fourth film containing the same light-emitting material as the first or third light-emitting material, the fourth film being in contact with a lower surface of the second light-emitting layer, wherein the second light-emitting layer emits light from a portion spaced apart from the upper surface in contact with the third film and from the lower surface in contact with the fourth film, wherein the third organic electroluminescent element includes a fifth film containing the same light-emitting material as the first or second light-emitting material, the fifth film being in contact with a lower surface of the third light-emitting layer, wherein the third organic electroluminescent element does not include a sixth film containing the same light-emitting material as the first or second light-emitting material, the sixth film being in contact with an upper surface of the third light-emitting layer, and wherein the third light-emitting layer emits light from a portion spaced apart from the lower surface in contact with the fifth film.

Hereinafter, this organic electroluminescent device is referred to also as an organic electroluminescent device according to a thirteenth aspect.

The preferred embodiments of the organic electroluminescent devices according to the first to third aspects may be appropriately applied to the organic electroluminescent devices according to the fourth to thirteenth organic electroluminescent devices. Particularly, the preferred embodiments of the organic electroluminescent device according to the first aspect are preferable for the organic electroluminescent devices according to the fourth and fifth aspects. The preferred embodiments of the organic electroluminescent device according to the second aspect are preferable for the organic electroluminescent devices according to the sixth to eighth aspects. The preferred embodiments of the organic electroluminescent device according to the third aspect are preferable for the organic electroluminescent devices according to the ninth and tenth aspects.

The first and second films of the organic electroluminescent device according to the thirteenth aspect correspond to the first and second films, respectively, of the organic electroluminescent device according to the first aspect. The third and fourth films of the organic electroluminescent device according to the thirteenth aspect correspond to the first and second films, respectively, of the organic electroluminescent device according to the second aspect. The fifth and sixth films of the organic electroluminescent device according to the thirteenth aspect correspond to the first and second films, respectively, of the organic electroluminescent device according to the third aspect.

Another aspect of the embodiment of the invention may be a manufacturing method for an organic electroluminescent device including a plurality of organic electroluminescent elements, the plurality of organic electroluminescent elements being able to emit light of different colors, each of the plurality of organic electroluminescent elements including a light-emitting layer, the manufacturing method comprising a light-emitting layer vapor-deposition step of forming the light-emitting layers sequentially, wherein, among the light-emitting layers, a light-emitting layer formed first emits light from a portion spaced apart from an upper surface of the light-emitting layer formed first.

Hereinafter, this manufacturing method for organic electroluminescent device is referred to also as a manufacturing method for an organic electroluminescent device according to a fourteenth aspect.

A preferred embodiment of the manufacturing method for an organic electroluminescent device according to the fourteenth aspect will next be described.

In the light-emitting layer vapor-deposition step, the light-emitting layers may be formed by sequentially vapor-depositing, on a substrate, a plurality of light-emitting materials that are able to emit light of different colors with openings of vapor deposition masks disposed at different positions.

Another aspect of the embodiment of the invention may be a manufacturing method for an organic electroluminescent device including at least three organic electroluminescent elements that are able to emit light of different colors, each of the at least three organic electroluminescent elements including a light-emitting layer, the manufacturing method comprising a light-emitting layer vapor-deposition step of forming the at least three light-emitting layers sequentially, wherein, among the at least three light-emitting layers, a light-emitting layer other than a light-emitting layer formed first or last emits light from a portion spaced apart from an upper surface and a lower surface of the light-emitting layer other than the light-emitting layer formed first or last.

Hereinafter, this manufacturing method for organic electroluminescent device is referred to also as a manufacturing method for an organic electroluminescent device according to a fifteenth aspect.

A preferred embodiment of the manufacturing method for an organic electroluminescent device according to the fifteenth aspect will next be described.

In the light-emitting layer vapor-deposition step, the at least three light-emitting layers may be formed by sequentially vapor-depositing, on a substrate, at least three light-emitting materials that are able to emit light of different colors with openings of vapor deposition masks disposed at different positions.

Another aspect of the present embodiment of the may be a manufacturing method for an organic electroluminescent device including a plurality of organic electroluminescent elements that are able to emit light of different colors, each of the plurality of organic electroluminescent elements including a light-emitting layer, the manufacturing method comprising a light-emitting layer vapor-deposition step of forming the plurality of light-emitting layers sequentially, wherein, among the light-emitting layers, a light-emitting layer formed last emits light from a portion spaced apart from a lower surface of the light-emitting layer formed last.

Hereinafter, this manufacturing method for organic electroluminescent device is referred to also as a manufacturing method for an organic electroluminescent device according to a sixteenth aspect.

A preferred embodiment of the manufacturing method for an organic electroluminescent device according to the sixteenth aspect will next be described.

In the light-emitting layer vapor-deposition step, the light-emitting layers may be formed by sequentially vapor-depositing, on a substrate, a plurality of light-emitting materials that are able to emit light of different colors with openings of vapor deposition masks disposed at different positions.

Another aspect of the embodiment of the invention may be a manufacturing method for an organic electroluminescent device including a plurality of organic electroluminescent elements on a substrate, the plurality of organic electroluminescent elements being able to emit light of different colors, each of the plurality of organic electroluminescent elements including the first electrode, the light-emitting layer, and the second electrode in this order from the side toward the substrate, the manufacturing method comprising a light-emitting layer vapor-deposition step of forming the light-emitting layers sequentially, wherein, among the light-emitting layers, a light-emitting layer formed first is a light-emitting layer having the capability of transporting charges of the same polarity as charges injected from the second electrode.

Hereinafter, this manufacturing method for organic electroluminescent device is referred to also as a manufacturing method for an organic electroluminescent device according to a seventeenth aspect.

Another aspect of the present embodiment of the may be a manufacturing method for an organic electroluminescent device including a plurality of organic electroluminescent elements on a substrate, the plurality of organic electroluminescent elements being able to emit light of different colors, each of the plurality of organic electroluminescent elements including the first electrode, the light-emitting layer, and the second electrode in this order from the side toward the substrate, the manufacturing method comprising a light-emitting layer vapor-deposition step of forming the light-emitting layers sequentially and a step of selectively forming a charge blocking layer for blocking charges injected from the second electrode, the charge blocking layer being formed between the first electrode and a light-emitting layer formed first among the light-emitting layers.

Hereinafter, this manufacturing method for organic electroluminescent device is referred to also as a manufacturing method for an organic electroluminescent device according to an eighteenth aspect.

Another aspect of the present embodiment of the may be a manufacturing method for an organic electroluminescent device including at least three organic electroluminescent elements that are able to emit light of different colors, each of the at least three organic electroluminescent elements including a light-emitting layer, the manufacturing method comprising a light-emitting layer vapor-deposition step of forming the at least three light-emitting layers sequentially, wherein, among the at least three light-emitting layers, a light-emitting layer other than a light-emitting layer formed first or last contains a host material having electron transport capability and an assist material having hole transport capability, and wherein a HOMO level of the assist material is higher than a HOMO level of the host material.

Hereinafter, this manufacturing method for organic electroluminescent device is referred to also as a manufacturing method for an organic electroluminescent device according to a nineteenth aspect.

Another aspect of the embodiment of the invention may be a manufacturing method for an organic electroluminescent device including at least three organic electroluminescent elements that are able to emit light of different colors, each of the at least three organic electroluminescent elements including a light-emitting layer, the manufacturing method comprising a light-emitting layer vapor-deposition step of forming the at least three light-emitting layers sequentially, wherein, among the at least three light-emitting layers, a light-emitting layer other than a light-emitting layer formed first or last contains a host material having hole transport capability and an assist material having electron transport capability, and wherein a LUMO level of the assist material is lower than a LUMO level of the host material.

Hereinafter, this manufacturing method for organic electroluminescent device is referred to also as a manufacturing method for an organic electroluminescent device according to a twentieth aspect.

Another aspect of the embodiment of the invention may be a manufacturing method for an organic electroluminescent device including a plurality of organic electroluminescent elements that are able to emit light of different colors, each of the plurality of organic electroluminescent elements including the first electrode, the light-emitting layer, and the second electrode in this order from the side toward the substrate, the manufacturing method comprising a light-emitting layer vapor-deposition step of forming the light-emitting layers sequentially, wherein, among the light-emitting layers, a light-emitting layer formed last is a light-emitting layer having the capability of transporting charges of the same polarity as charges injected from the first electrode.

Hereinafter, this manufacturing method for organic electroluminescent device is referred to also as a manufacturing method for an organic electroluminescent device according to a twenty first aspect.

Another aspect of the embodiment of the invention may be a manufacturing method for an organic electroluminescent device including a plurality of organic electroluminescent elements on a substrate, the plurality of organic electroluminescent elements being able to emit light of different colors, each of the plurality of organic electroluminescent elements including the first electrode, the light-emitting layer, and the second electrode in this order from the side toward the substrate, the manufacturing method comprising a light-emitting layer vapor-deposition step of forming the light-emitting layers sequentially and a step of selectively forming a charge blocking layer for blocking charges injected from the first electrode, the charge blocking layer being formed between the second electrode and a light-emitting layer formed last among the light-emitting layers.

Hereinafter, this manufacturing method for organic electroluminescent device is referred to also as a manufacturing method for an organic electroluminescent device according to a twenty second aspect.

The organic electroluminescent devices according to the fourteenth to twenty second aspects may be appropriately combined, and such aspects are also included in the embodiment of the invention.

For example, the organic electroluminescent devices according to the fourteenth to sixteenth aspects may be combined to each other. Specifically, another aspect of the embodiment of the invention may be a manufacturing method for an organic electroluminescent device including at least three organic electroluminescent elements that are able to emit light of different colors, each of the at least three organic electroluminescent elements including a light-emitting layer, the manufacturing method comprising a light-emitting layer vapor-deposition step of forming the at least three light-emitting layers sequentially, wherein, among the at least three light-emitting layers, a light-emitting layer formed first emits light from a portion spaced apart from an upper surface of the light-emitting layer formed first, wherein, among the at least three light-emitting layers, a light-emitting layer other than a light-emitting layer formed first or last emits light from a portion spaced apart from an upper surface and a lower surface of the light-emitting layer other than the light-emitting layer formed first or last, and wherein, among the at least three light-emitting layers, the light-emitting layer formed last emits light from a portion spaced apart from a lower surface of the light-emitting layer formed last.

Hereinafter, this manufacturing method for organic electroluminescent device is referred to also as a manufacturing method for an organic electroluminescent device according to a twenty third aspect.

The preferred embodiments of the organic electroluminescent device manufacturing methods according to the fourteenth to sixteenth aspects may be appropriately applied to the organic electroluminescent device manufacturing methods according to the seventeenth to twenty third aspects.

Advantageous Effects of Invention

According to the embodiment of the invention, an organic electroluminescent device in which the occurrence of color mixing can be suppressed and a manufacturing method for the organic electroluminescent device can be realized.

DESCRIPTION OF EMBODIMENTS

The embodiment of the invention will next be described in more detail by way of embodiments with reference to the drawings. However, the embodiment of the invention is not limited only to these embodiments.

The term "lower surface" as used herein means a surface on the side toward a substrate (e.g., a TFT substrate or an insulating substrate), i.e., a surface facing the substrate, and the term "upper surface" means a surface opposite the lower surface.

The term "light-emitting position of a light-emitting layer" means a region of the light-emitting layer in which a light-emitting source is present, i.e., a region of the light-emitting layer in which light is generated.

The term "light-emitting layer of a given color" and "light-emitting material of a given color" mean a light-emitting layer able to emit light of the given color and a light-emitting material able to emit light of the given color.

As for a HOMO level and a LUMO level, they are said to be "high" when their difference from the vacuum level is small and said to be "low" when their difference from the vacuum level is large.

Embodiment 1

In the present embodiment, a description will be given mainly of a bottom emission type organic EL device for an RGB full-color display and a manufacturing method therefor. However, the present embodiment is also applicable to organic EL elements of other types such as a top emission type organic EL element and to manufacturing methods therefor.

In the bottom emission type organic EL device, light is extracted from a TFT substrate side. In the top emission type organic EL device, light is extracted from the side opposite the TFT substrate side.

First, the overall structure of the organic EL device according to the present embodiment will be described.

Figure 1:
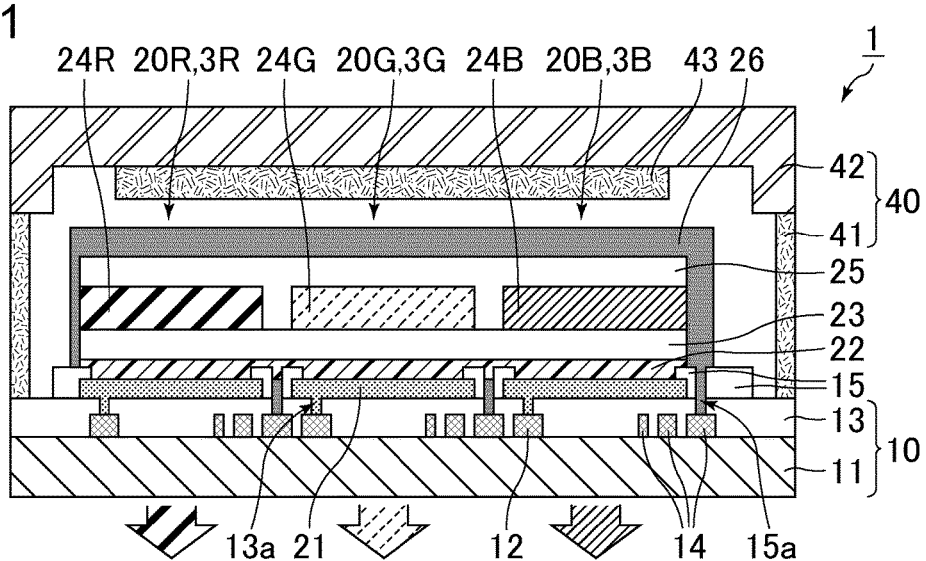
FIG. 1 is a schematic cross-sectional view of an organic EL device in embodiment 1.
Figure 2:
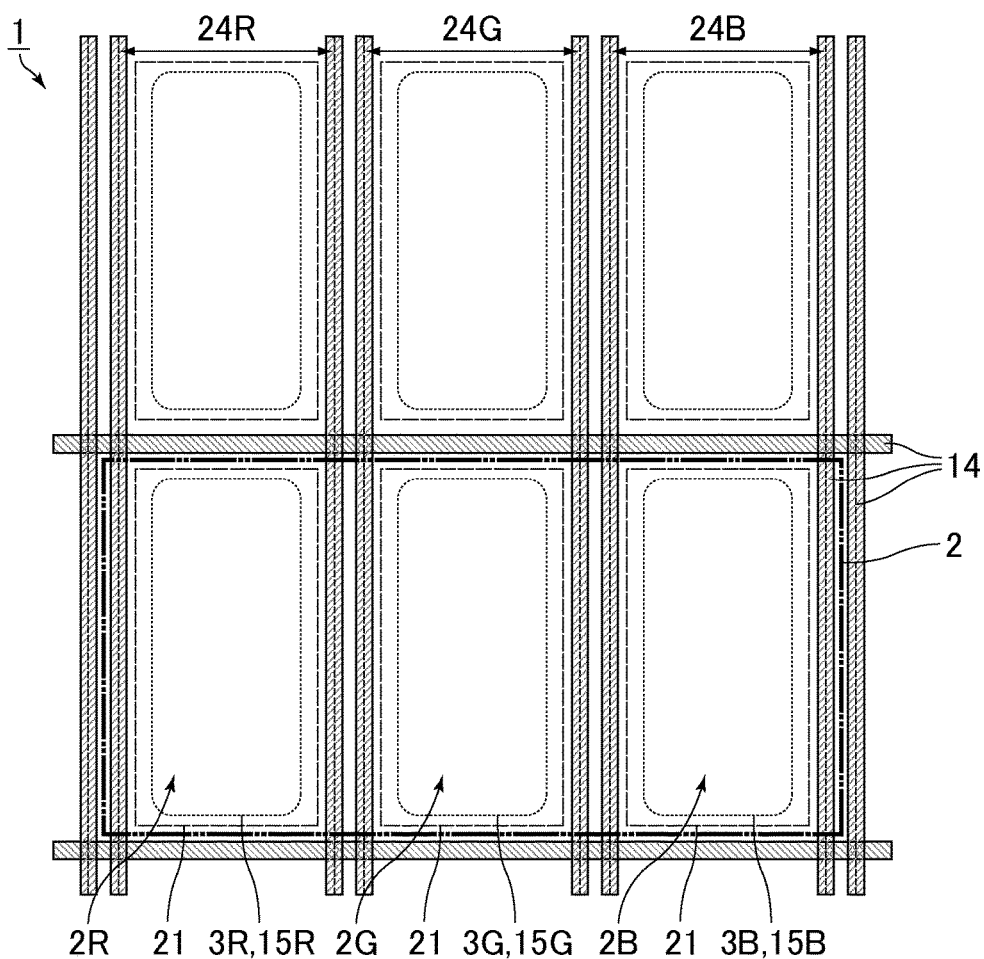
FIG. 2 is a schematic plan view of the organic EL device in embodiment 1.

FIG. 1 is a schematic cross-sectional view of the organic EL device in embodiment 1. FIG. 2 is a schematic plan view of the organic EL device in embodiment 1.

As shown in FIG. 1, the organic EL device 1 according to the present embodiment includes: a TFT substrate 10 on which a plurality of TFTs 12 are disposed; a plurality of organic EL elements 20R, 20G and 20B disposed on the TFT substrate 10 and connected to their respective TFTs 12; and a sealing member 40 that covers these organic EL elements 20R, 20G and 20B.

The organic EL device 1 includes, as the sealing member 40, a sealing resin 41 and a sealing substrate 42. The sealing substrate 40 is bonded through the sealing resin 41 to the TFT substrate 10 on which the organic EL elements 20R, 20G and 20B are stacked, and the organic EL elements 20R, 20G and 20B are thereby sealed between the TFT substrate 10 and the sealing substrate 42. The organic EL device 1 further includes a desiccant 43 affixed to a surface of the sealing substrate 40 that faces the organic EL elements 20R, 20G and 20B. This structure prevents oxygen and moisture from entering the organic EL elements 20R, 20G, and 20B from the outside.

The TFT substrate 10 includes a transparent insulating substrate 11 serving as a support substrate. As shown in FIG. 2, a plurality of traces 14 are formed on the insulating substrate 11, and the plurality of traces 14 include a plurality of gate lines extending in a horizontal direction and further include a plurality of signal lines and a plurality of power supply lines that extend in a vertical directions and cross the gate lines. The gate lines are connected to a gate line driving circuit (not shown) for driving the gate lines, and the signal lines are connected to a signal line driving circuit (not shown) for driving the signal lines.

The organic EL device 1 functions as an RGB full-color active matrix display and includes a display area on which an image can be displayed. A plurality of pixels 2 are arranged in a matrix form in the display area. A red, green, or blue sub-pixel (dot) 2R, 2G, or 2B is disposed in each of regions separated by the traces 14. The sub-pixels 2R, 2G, and 2B are arranged in a matrix form. The sub-pixels 2R, 2G, and 2B are arranged in stripes. Specifically, sub-pixels 2R, 2G, or 2B with the same color are arranged in vertical rows, and red, green, and blue sub-pixels 2R, 2G, and 2B are arranged sequentially in horizontal rows. Three sub-pixels 2R, 2G, and 2B form one pixel 2.

The organic EL elements 20R, 20G and 20B can emit red light, green light, and blue light, respectively, and form their respective color sub-pixels 2R, 2G, and 2B.

The organic EL elements 20R, 20G and 20B are light-emitting elements that can emit high intensity light under a low DC driving voltage. The organic EL elements 20R, 20G, and 20B are connected to their corresponding TFTs 12. When a TFT 12 corresponding to an organic EL element is selected by scanning with a gate signal and is turned on, an electric current corresponding to an image signal flows into the organic EL element. The light emission intensity of each of the organic EL elements 20R, 20G and 20B is controlled in the manner described above. The colors and brightnesses of the plurality of pixels 2 are thereby controlled individually, and an image is displayed in the display area.

Next, the configuration of the TFT substrate 10 and the organic EL elements 20R, 20G and 20B will be described in detail.

As shown in FIG. 1, the TFT substrate 10 includes, in addition to the above-described components such as the insulating substrate 11, the TFTs 12, and the traces 14: an interlayer insulating film (planarization film) 13 that covers the TFTs 12 and the traces 14; and an edge cover 15 that is an insulating layer formed on the interlayer insulating film 13. The TFTs 12 may have a commonly used structure, and the illustration and description of layers included in the TFTs 12 will be omitted.

Each of the organic EL elements 20R, 20G, and 20B includes a first electrode 21 disposed on the interlayer insulating film 13, an organic EL layer disposed on the first electrode 21, and a second electrode 26 disposed on the organic EL layer.

The interlayer insulating film 13 is formed on the insulating substrate 11 over substantially the entire region thereof. The interlayer insulating film 13 has a plurality of contact holes 13a, and the first electrodes 21 are electrically connected to their corresponding TFTs 12 through the contact holes 13a. The TFTs 12 are thereby electrically connected to their corresponding organic EL elements 20R, 20G, and 20B.

The edge cover 15 is formed in order to prevent a short circuit between each first electrode 21 and the second electrode 26. A short circuit may occur at edges of the first electrodes 21 because of a small thickness of the organic EL layers or electric field concentration. Therefore, the edge cover 15 is formed so as to cover the circumferential edges of the first electrodes 21.

The edge cover 15 has openings 15R, 15G, and 15B that are provided such that portions of the first electrodes 21 other than their circumferential edges are exposed through the openings. The openings 15R, 15G, and 15B serve as light-emitting regions 3R, 3G, and 3B of the organic EL elements 20R, 20G and 20B (the sub-pixels 2R, 2G, and 2B). In other words, the display area is divided into a plurality of regions by the insulating edge cover 15, and the organic EL elements 20R, 20G, and 20B (the sub-the pixels 2R, 2G, and 2B) are disposed in the divided regions. As described above, the edge cover 15 functions also as an element dividing film.

The light-emitting regions 3R, 3G, and 3B are arranged in a matrix form so as not to overlap each other.

The first electrodes 21 function as anodes for injecting (supplying) holes into the organic EL layers. The first electrodes 21 are disposed in a matrix form corresponding to the sub-pixels 2R, 2G, and 2B. The first electrodes 21 are formed so as to overlap their corresponding entire light-emitting regions 3R, 3G, and 3B (the openings 15R, 15G, and 15B).

Each organic EL layer includes a hole injection layer 22, a hole transport layer 23, a light-emitting layer 24R, 24G, or 24B, and an electron transport layer 25, and these layers are stacked in this order from the side toward the insulating substrate 11. An electron injection layer may be disposed between the electron transport layer 25 and the second electrode 26.

The hole injection layer 22 is a layer having the function of improving the efficiency of hole injection into the light-emitting layers 24R, 24G, and 24B. The hole transport layer 23 is a layer having the function of improving the efficiency of hole transport to the light-emitting layers 24R, 24G, and 24B. The hole injection layer 22 and the hole transport layer 23 extend continuously over the entire display area and cover all the first electrodes 21.

Each of the light-emitting layers 24R, 24G, and 24B is a layer having the function of emitting light as a result of recombination of holes injected from the first electrode 21 side and electrons injected from the second electrode 26 side. The light-emitting layers 24R, 24G, and 24B contain different light-emitting materials. Holes and electrons injected into the light-emitting layers 24R, 24G, and 24B are recombined within the light-emitting layers 24R, 24G, and 24B. Each light-emitting material is excited by the energy of recombination of holes and electrons to thereby generate excitons, and light having a wavelength corresponding to the excitation energy is emitted when the excited state returns the ground state. Since the light-emitting materials contained in the light-emitting layers 24R, 24G, and 24B have different excitation energies, the light-emitting layers 24R, 24G, and 24B can emit light of different colors. Since the light emission spectra of the light-emitting materials contained in the light-emitting layers 24R, 24G, and 24B have peaks in red, green, and blue regions, respectively, the light-emitting layers 24R, 24G, and 24B can emit red light, green light, and blue light, respectively.

The light-emitting layers 24R, 24G, and 24B are each formed into a vertical stripe shape so as to correspond to the stripe arrangement of the sub-pixels 2R, 2G, and 2B. The light-emitting layers 24R, 24G, and 24B cover the openings 15R, 15G, and 15B, respectively. The light-emitting layers 24R, 24G, and 24B extend continuously over the entire light-emitting regions 3R, 3G, and 3B, respectively, arranged vertically. The light-emitting layers 24R, 24G, and 24B are formed from high-light emission efficiency materials such as low-molecular weight fluorescent dyes or metal complexes.

The electron transport layer 25 is a layer having the function of improving the efficiency of electron transport from the second electrode 26 to the light-emitting layers 24R, 24G, and 24B. The electron injection layer is a layer having the function of improving the efficiency of electron induction from the second electrode 26 to the light-emitting layers 24R, 24G, and 24B.

The electron transport layer 25 extends continuously over the entire display area and covers the light-emitting layers 24R, 24G, and 24B and the hole transport layer 23. The electron injection layer is also formed so as to extend continuously over the entire display area and covers the electron transport layer 25.

The second electrode 26 functions as a cathode for injecting (supplying) electrons into the organic EL layers. The second electrode 26 extends continuously over the entire display area and covers the electron transport layer 25 or the electron injection layer. The second electrode 26 is electrically connected to a trace 14.

Layers other than the light-emitting layers 24R, 24G, and 24B are not the essential layers of the organic EL layers and may be formed as needed according to the required characteristics of the organic EL elements 20R, 20G and 20B.

For example, any of the following layered structures (1) to (9) may be used for the organic EL elements 20R, 20G and 20B.

(1) First electrode/light-emitting layer/second electrode (2) First electrode/hole transport layer/light-emitting layer/second electrode (3) First electrode/light-emitting layer/electron transport layer/second electrode (4) First electrode/hole transport layer/light-emitting layer/electron transport layer/second electrode (5) First electrode/hole injection layer/hole transport layer/light-emitting layer/second electrode (6) First electrode/hole injection layer/hole transport layer/light-emitting layer/electron transport layer/second electrode (7) First electrode/light-emitting layer/electron transport layer/electron injection layer/second electrode (8) First electrode/hole transport layer/light-emitting layer/electron transport layer/electron injection layer/second electrode (9) First electrode/hole injection layer/hole transport layer/light-emitting layer/electron transport layer/electron injection layer/second electrode The hole injection layer and the hole transport layer may be integrated together. Specifically, the hole injection layer and the hole transport layer may be formed as a layer having the function of the hole injection layer and the function of the hole transport layer (as a layer serving as the hole injection layer and also as the hole transport layer).

Similarly, the electron transport layer and the electron injection layer may be integrated together. Alternatively, the electron injection layer and the electron transport layer may be formed as a layer having the function of the electron injection layer and also the function of the electron transport layer (serving as the electron injection layer and also as the electron transport layer).

The layered structure of the organic EL elements 20R, 20G and 20B is not particularly limited to those shown in (1) to (9) above, and any desired layered structure may be used according to the required characteristics.

The structures of the organic EL elements 20R, 20G and 20B will be described in more detail.

Figure 3:
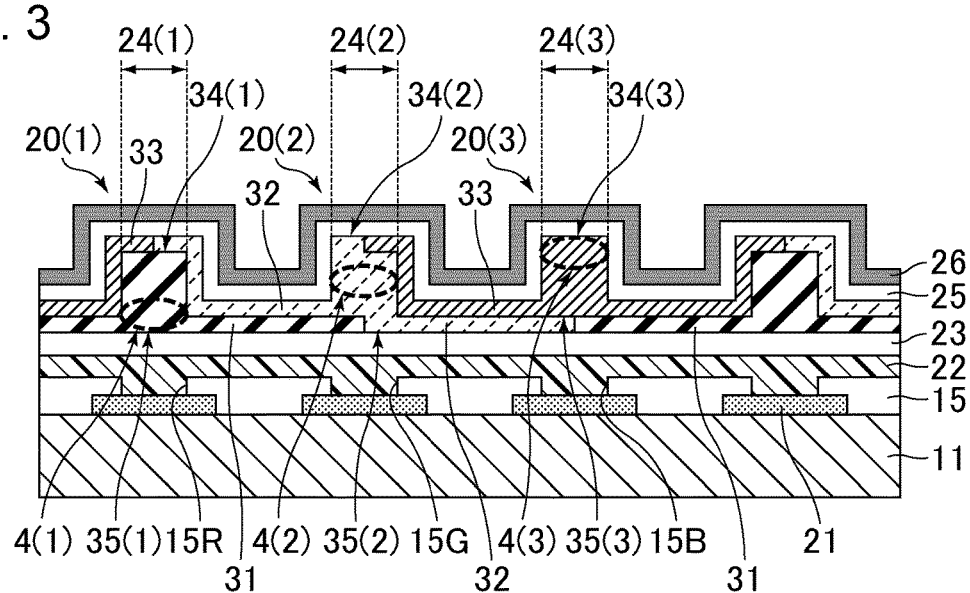
FIG. 3 is a schematic cross-sectional view of the organic EL device in embodiment 1.
Figure 4:
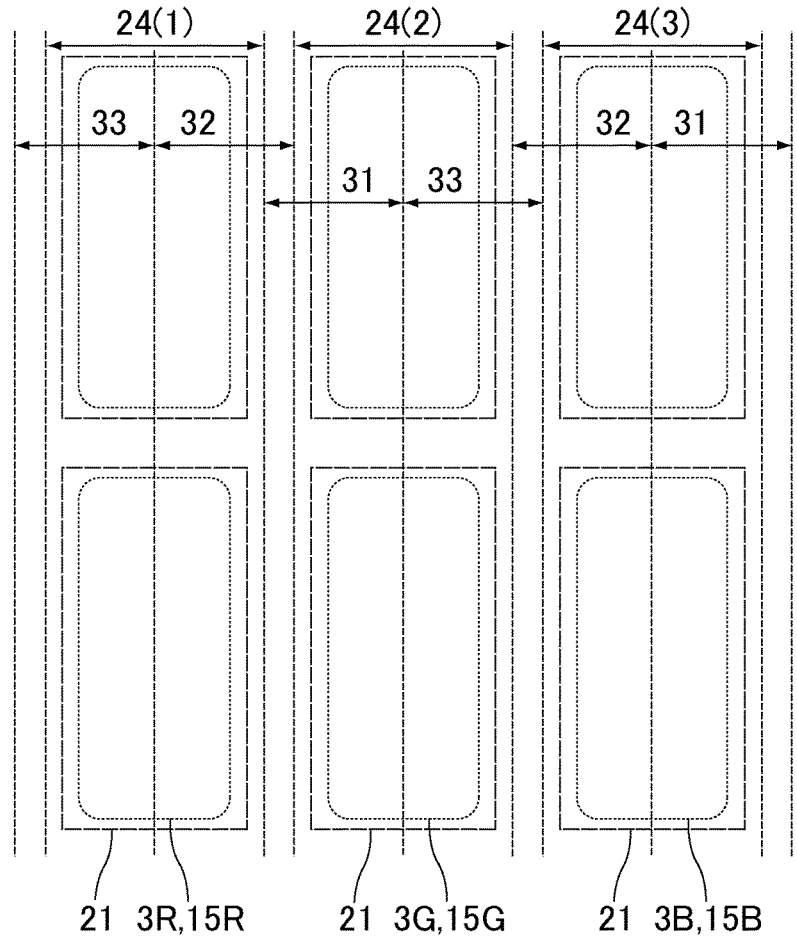
FIG. 4 is a schematic plan view of the organic EL device in embodiment 1.
Figure 5:
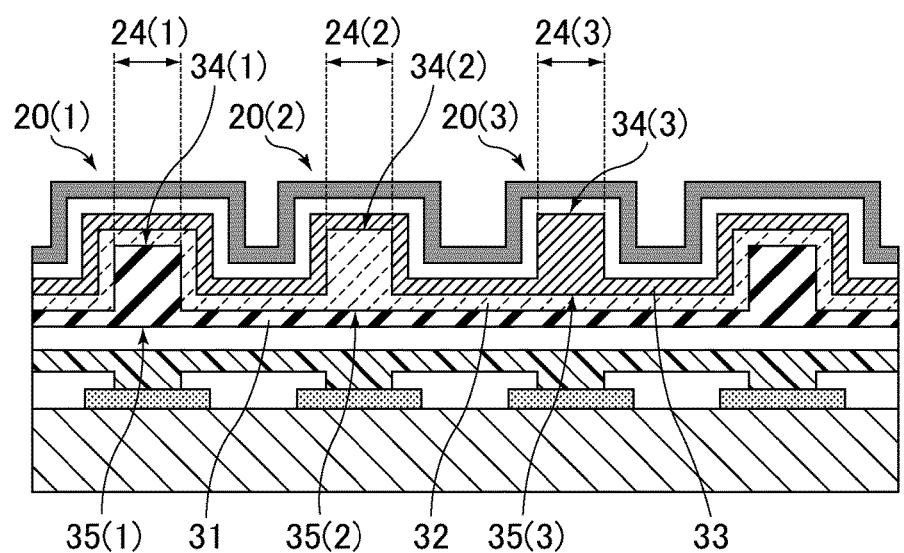
FIG. 5 is a schematic cross-sectional view of the organic EL device in embodiment 1.

FIG. 3 is a schematic cross-sectional view of the organic EL device in embodiment 1. FIG. 4 is a schematic plan view of the organic EL device in embodiment 1. FIG. 5 is a schematic cross-sectional view of the organic EL device in embodiment 1.

As shown in FIG. 3, among the light-emitting layers 24R, 24G, and 24B of three colors, a light-emitting layer that is formed first, e.g., the red light-emitting layer 24R, is referred to as a first light-emitting layer 24(1). A light-emitting layer that is formed second, e.g., the green light-emitting layer 24G, is referred to as a second light-emitting layer 24(2), and a light-emitting layer that is formed last, e.g., the blue light-emitting layer 24B, is referred to as a third light-emitting layer 24(3). Organic EL elements including the first, second, and third light-emitting layers 24(1), 24(2), and 24(3) are referred to as first, second, and third organic EL elements 20(1), 20(2), and 20(3), respectively. The first organic EL element 20(1) can correspond to the organic electroluminescent elements I and IV described above. The second organic EL element 20(2) can correspond to the organic electroluminescent elements II and VI described above. The third organic EL element 20(3) can correspond to the organic electroluminescent elements III and IX described above. The organic EL device in the present embodiment can correspond to the organic electroluminescent device according to the eleventh aspect described above. No particular limitation is imposed on the order of formation of the light-emitting layers 24R, 24G, and 24B of the three colors, and the order may be determined as needed.

When a plurality of light-emitting materials are deposited by an evaporation method to form color patterns, it is ideal that the light-emitting materials are vapor-deposited only on their corresponding prescribed sub-pixel regions and are not vapor-deposited on other sub-pixel regions, so that different light-emitting materials do not overlap each other. However, with the gap deposition method or the contact deposition method, since a gap is formed between the substrate and the vapor deposition mask, the light-emitting materials may be vapor-deposited on regions other than the prescribed regions.

In the present embodiment, as shown in FIGS. 3 and 4, the light-emitting materials of the light-emitting layers 24(1), 24(2), and 24(3) are vapor-deposited not only on their corresponding sub-pixel regions but also on regions around the sub-pixel regions. Therefore, first, second, and third films (hereinafter referred to as foreign material films) 31, 32, and 33 containing the same light-emitting materials as those of the first, second, and third light-emitting layers 24(1), 24(2), and 24(3), respectively, are formed. The first, second, and third foreign material films 31, 32, and 33 are films unintendedly formed by vapor-deposition of the light-emitting materials on regions other than the prescribed regions and are formed simultaneously with the first, second, and third light-emitting layers 24(1), 24(2), and 24(3), respectively. The first, second, and third foreign material films 31, 32, and 33 are formed around the first, second, and third light-emitting layers 24(1), 24(2), and 24(3), respectively. Each light-emitting layer and its corresponding foreign material film that contain the same light-emitting material are continuous with each other. Each foreign material film extends outward from edges of its corresponding light-emitting layer containing the same light-emitting material as the foreign material film.

Therefore, the second foreign material film 32 containing the same light-emitting material as the second light-emitting layer 24(2) and the third foreign material film 33 containing the same light-emitting material as the third light-emitting layer 24(3) are disposed above the first light-emitting layer 24(1). The first foreign material film 31 containing the same light-emitting material as the first light-emitting layer 24(1) is disposed below the second light-emitting layer 24(2), and the third foreign material film 33 containing the same light-emitting material as the third light-emitting layer 24(3) is disposed above the second light-emitting layer 24(2). The first foreign material film 31 containing the same light-emitting material as the first light-emitting layer 24(1) and the second foreign material film 32 containing the same light-emitting material as the second light-emitting layer 24(2) are disposed below the third light-emitting layer 24(3).

Therefore, the first organic EL element 20(1) includes the second and third foreign material films 32 and 33 between the second electrode 26 and the first light-emitting layer 24(1). The second organic EL element 20(2) includes the first foreign material film 31 between the first electrode 21 and the second light-emitting layer 24(2) and includes the third foreign material film 33 between the second electrode 26 and the second light-emitting layer 24(2). The third organic EL element 20(3) includes the first and second foreign material films 31 and 32 between the first electrode 21 and the third light-emitting layer 24(3).

In the first organic EL element 20(1), although no foreign material film is present below a lower surface 35(1) of the first light-emitting layer 24(1), the second and third foreign material films 32 and 33 are in contact with part of an upper surface 34(1) of the first light-emitting layer 24(1). In the second organic EL element 20(2), the first foreign material film 31 is in contact with part of a lower surface 35(2) of the second light-emitting layer 24(2), and the third foreign material film 33 is in contact with part of an upper surface 34(2) of the second light-emitting layer 24(2). In the third organic EL element 20(3), although no foreign material film is present above an upper surface 34(3) of the third light-emitting layer 24(3), the first and second foreign material films 31 and 32 are in contact with part of a lower surface 35(3) of the third light-emitting layer 24(3). Therefore, color mixing may occur in each organic EL element due to light emission from the first, second, or third foreign material film 31, 32, or 33.

However, in the present embodiment, when a voltage equal to or higher than a threshold value is applied between the first electrodes 21 and the second electrode 26 and a current equal to or larger than a prescribed value flows between the first electrodes 21 and the second electrode 26, the first light-emitting layer 24(1) emits light from a portion spaced apart from the upper surface 34(1). In this case, the second light-emitting layer 24(2) emits light from a portion spaced apart from the lower surface 35(2) and from the upper surface 34(2), and the third light-emitting layer 24(3) emits light from a portion spaced apart from the lower surface 35(3). Therefore, light emission of the first, second, and third foreign material films 31, 32, and 33 can be suppressed, and the occurrence of color mixing in the organic EL elements can be suppressed. Since no foreign material film is present below the lower surface 35(1), the occurrence of color mixing on the lower surface 35(1) side can be prevented. Since no foreign material film is present above the upper surface 34(3), the occurrence of color mixing on the upper surface 34(3) side can be prevented. A display with high color purity and high display quality can thereby be realized.

More specifically, in the first light-emitting layer 24(1), holes injected into the first light-emitting layer 24(1) and electrons injected into the first light-emitting layer 24(1) are recombined in a portion spaced apart from the upper surface 34(1) to thereby generate excitons. In the second light-emitting layer 24(2), holes injected into the second light-emitting layer 24(2) and electrons injected into the second light-emitting layer 24(2) are recombined in a portion spaced apart from the lower surface 35(2) and from the upper surface 34(2) to thereby generate excitons. In the third light-emitting layer 24(3), holes injected into the third light-emitting layer 24(3) and electrons injected into the third light-emitting layer 24(3) are recombined in a portion spaced apart from the lower surface 35(3) to thereby generate excitons. Therefore, generation of excitons in the foreign material films can be suppressed. In addition, transfer of the excitation energy generated in each light-emitting layer to a foreign material film adjacent to the light-emitting layer can be suppressed. This can suppress light emission of each of the foreign material films.

From the viewpoint of more effectively suppressing the occurrence of color mixing, it is preferable that the light-emitting position 4(1) of the first light-emitting layer 24(1) is located on the side close to the lower surface 35(1) as shown in FIG. 3, and it is more preferable that the light-emitting position 4(1) is disposed on the lower surface 35(1). The light-emitting position 4(1) of the first light-emitting layer 24(1) may be located in a portion including the lower surface 35(1) and obtained by trisecting the first light-emitting layer 24(1) in its thickness direction.

From the same point of view, it is preferable that the light-emitting position 4(2) of the second light-emitting layer 24(2) is located in a central portion as shown in FIG. 3, and it is more preferable that the light-emitting position 4(2) is located at the center of the second light-emitting layer 24(2) in its thickness direction. The light-emitting position 4(2) of the second light-emitting layer 24(2) may be located in a central portion when the second light-emitting layer 24(2) is trisected in the thickness direction.

From the same point of view, it is preferable that the light-emitting position 4(3) of the third light-emitting layer 24(3) is located on the side close to the upper surface 34(3) as shown in FIG. 3, and it is more preferable that the light-emitting position 4(3) is located on the upper surface 34(3). The light-emitting position 4(3) of the third light-emitting layer 24(3) may be located in a portion including the upper surface 34(3) and obtained by trisecting the third light-emitting layer 24(3) in its thickness direction.

The light-emitting position of the light-emitting layer of an organic EL element can be determined by a simulation based on the HOMO, LUMO, and charge transport capability of each of layers of the organic EL element including the light-emitting layer. In the case of a light-emitting layer containing a dopant (guest material), the light-emitting position can be determined from verification experiments using samples with different doping positions.

When the light-emitting layers 24(1), 24(2), and 24(3) are each composed of only one material, i.e., only one component, the components of the first, second, and third foreign material films are substantially the same as the components of the first, second, and third light-emitting layers, respectively.

When the light-emitting layers 24(1), 24(2), and 24(3) each contain two or more materials, i.e., two or more components, the compositions of the first, second, and third foreign material films are generally different from the compositions of the first, second, and third light-emitting layers, respectively. However, the first, second, and third foreign material films generally do not contain components other than the components of the first, second, and third light-emitting layers. Specifically, each of the first, second, and third foreign material films generally contains at least one component selected from the two or more components of a corresponding one of the first, second, and third light-emitting layers. For example, each of the first, second, and third foreign material films may contain all the components of a corresponding one of the first, second, and third light-emitting layers, and the composition ratios of the first, second, and third foreign material films may be different from the composition ratios of the first, second, and third light-emitting layers, respectively.

No particular limitation is imposed on the plane shapes of the first, second, and third foreign material films 31, 32, and 33, and they may have, for example, an elongated shape such as a strip shape as shown in FIG. 4. The first, second, and third foreign material films 31, 32, and 33 may be formed along the first, second, and third light-emitting layers 24(1), 24(2), and 24(3), respectively. Since the first, second, and third foreign material films are unintendedly formed, they may have indefinite shapes. The first, second, and third foreign material films may be disposed over the entire display area or may be disposed only part of the display area.

Figure 6:
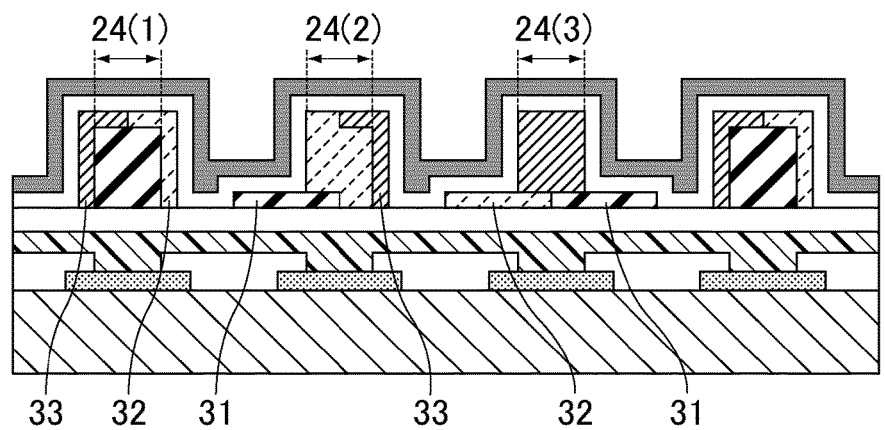
FIG. 6 is a schematic cross-sectional view of the organic EL device in embodiment 1.
Figure 7:
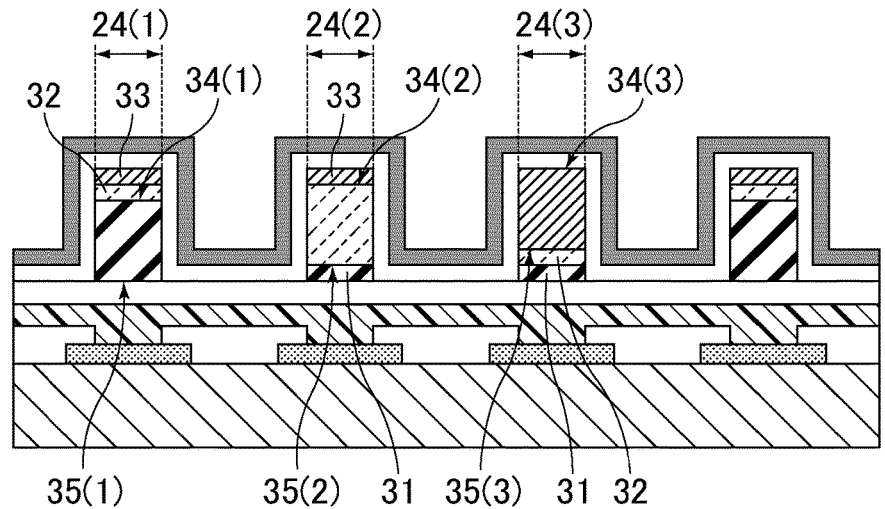
FIG. 7 is a schematic cross-sectional view of the organic EL device in embodiment 1.

FIGS. 5 to 7 are schematic cross-sectional views of the organic EL device in embodiment 1.

As shown in FIG. 5, at least one of the first, second, and third foreign material films 31, 32, and 33 may extend over the entire region between light-emitting layer portions containing the same light-emitting material as the least one foreign material film. In this case, in the first organic EL element 20(1), the second foreign material film 32 may be in contact with the entire upper surface 34(1) of the first light-emitting layer 24(1), and the third foreign material film 33 may be disposed above the second foreign material film 32. In the second organic EL element 20(2), the first foreign material film 31 may be in contact with the entire lower surface 35(2) of the second light-emitting layer 24(2), and the third foreign material film 33 may be in contact with the entire upper surface 34(2) of the second light-emitting layer 24(2). In the third organic EL element 20(3), the second foreign material film 32 may be in contact with the entire lower surface 35(3) of the third light-emitting layer 24(3), and the first foreign material film 31 may be disposed below the second foreign material film 32.

As shown in FIG. 6, the first, second, and third foreign material films 31, 32, and 33 may be disposed so as to be spaced apart from, i.e., discontinuous with, the first, second, and third light-emitting layers 24(1), 24(2), and 24(3), respectively. As shown in FIG. 7, the first, second, and third foreign material films 31, 32, and 33 may be disposed only above the upper surfaces 34(1) to 34(3) and/or below the lower surfaces 35(1) to 35(3).

No particular limitation is imposed on the thicknesses of the first, second, and third foreign material films. Generally, the first, second, and third foreign material films are thinner than the first, second, and third light-emitting layers. The first, second, and third foreign material films are thinner than the light-emitting layers in contact with these foreign material films. More specifically, the thickness of each foreign material film in a region above the upper surface or below the lower surface of a light-emitting layer in contact with the foreign material film is preferably from 0.01 nm to 5 nm, more preferably from 0.01 nm to 2 nm, and still more preferably 0.01 nm to 1 nm.

No particular limitation is imposed on the specific method for setting the light-emitting positions of the light-emitting layers to the above-described positions. In the present embodiment, the charge transport capability of each of the light-emitting materials is appropriately controlled according of the order of deposition of the first, second, and third light-emitting layers. By controlling the charge transport capability, i.e., electron transport capability and hole transport capability, of the light-emitting material of a light-emitting layer, the position at which recombination of electrons and holes occurs within the light-emitting layer can be controlled. This allows the light-emitting positions of the light-emitting layers to be appropriately set to the above-described positions.

Figure 8:
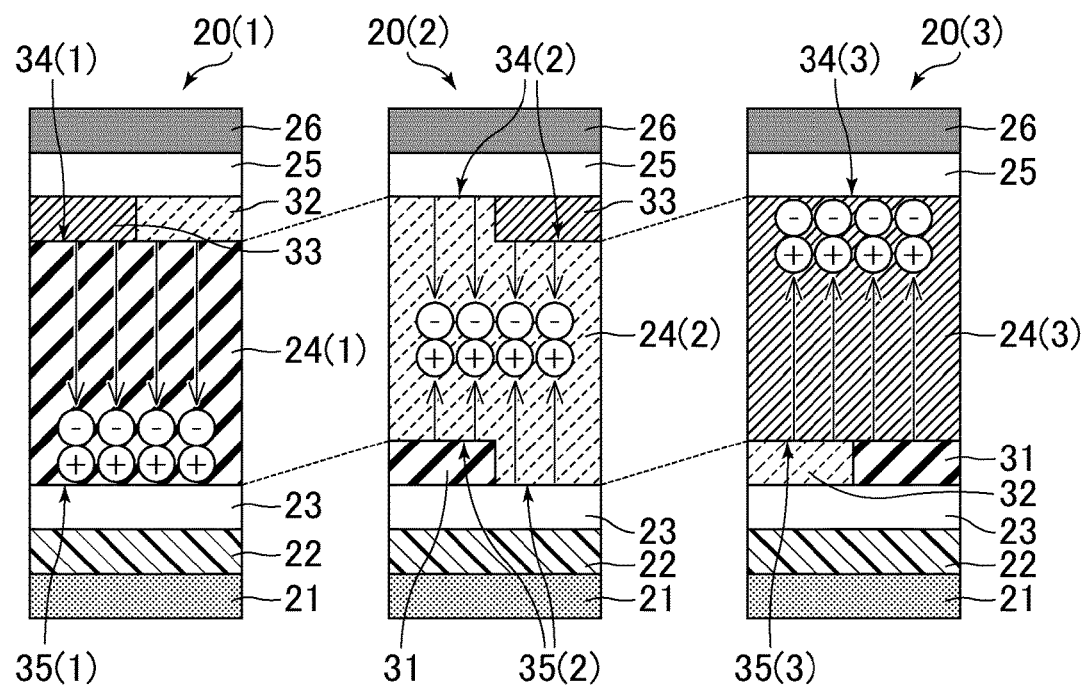
FIG. 8 shows schematic cross-sectional views of organic EL elements included in the organic EL device in embodiment 1.

FIG. 8 shows schematic cross-sectional views of organic EL elements included in the organic EL device in embodiment 1.

Specifically, as shown in FIG. 8, a light-emitting material having electron transport capability is used as the light-emitting material of the first light-emitting layer 24(1). This allows electrons flowing from the second electrode 26 serving as the cathode and holes flowing from a first electrode 21 serving as an anode to be recombined at the boundary between the hole transport layer 23 and the first light-emitting layer 24(1) and/or in the vicinity of the boundary. The energy lost when the excitons generated by the recombination return to the ground state is emitted as light, and therefore the first light-emitting layer 24(1) can emit light from the boundary between the hole transport layer 23 and the first light-emitting layer 24(1) and/or the vicinity of the boundary.

A light-emitting material having bipolar charge transport capability (hereinafter may be referred to as a bipolar capability) is used as the light-emitting material of the second light-emitting layer 24(2). This allows electrons and holes to be recombined at or near the central portion of the second light-emitting layer 24(2), thereby allowing the second light-emitting layer 24(2) to emit light from this portion.

A light-emitting material having hole transport capability is used as the light-emitting material of the third light-emitting layer 24(3). This allows electrons and holes to be recombined at the boundary between the electron transport layer 25 and the third light-emitting layer 24(3) and/or in the vicinity of the boundary, thereby allowing the third light-emitting layer 24(3) to emit light from this portion.

When the light-emitting material of the first light-emitting layer 24(1) has the capability of transporting charges of the same polarity as charges injected from the second electrode 26, the light-emitting position of the first light-emitting layer 24(1) can be located on its lower surface 35(1) even when the second and/or third foreign material film is present above the first light-emitting layer 24(1).

When the light-emitting material of the second light-emitting layer 24(2) has bipolar charge transport capability, the light-emitting position of the second light-emitting layer 24(2) can be located at or near the central portion of the second light-emitting layer 24(2) even when the second and/or third foreign material film is present above and/or below the second light-emitting layer 24(2).

When the light-emitting material of the third light-emitting layer 24(3) has the capability of transporting charges of the same polarity as charges injected from a first electrode 21, the light-emitting position of the third light-emitting layer 24(3) can be located on the upper surface 34(3) of the third light-emitting layer 24(3) even when the first and/or second foreign material film is present below the third light-emitting layer 24(3).

In the present description, the electron transport capability may mean that electron mobility is $1 \times 10^{-7}$ m/V·s or more and hole mobility is smaller by at least two orders of magnitude than the electron mobility, and the hole transport capability may mean that electron mobility is smaller by at least two orders of magnitude than hole mobility and the hole mobility is $1 \times 10^{-7}$ m/V·s or more. The bipolar capability may mean that electron mobility is $1 \times 10^{-8}$ cm/V·s or more, hole mobility is $1 \times 10^{-8}$ cm/V·s or more, and their difference is less than two orders of magnitude.

In the above description, each foreign material film is distinguished from its corresponding light-emitting layer. However, each foreign material film and its corresponding light-emitting layer may be considered as a single light-emitting layer containing the same light-emitting material. In this case, in the present embodiment, a plurality of light-emitting layers that emit light of different colors and are adjacent to each other are disposed such that at least part (e.g., an edge portion) of each light-emitting layer overlaps a light-emitting layer that emits light of a different color. Among the plurality of light-emitting layers overlapping each other, a lower light-emitting layer contains a light-emitting material having electron transport capability. Among the plurality of light-emitting layers overlapping each other, an upper light-emitting layer contains a light-emitting material having hole transport capability. Although the lower light-emitting layer overlaps other light-emitting layers, light emission from the overlapping portions of the light-emitting layers overlapping the lower light-emitting layer can be suppressed because the lower light-emitting layer contains the light-emitting material having electron transport capability. Although other light-emitting layers are present below the upper light-emitting layer, light emission from portions present below the upper light-emitting layer can be suppressed because the upper light-emitting layer contains the light-emitting material having hole transport capability.

A manufacturing method for the organic EL device 1 will next be described.

Figure 9:
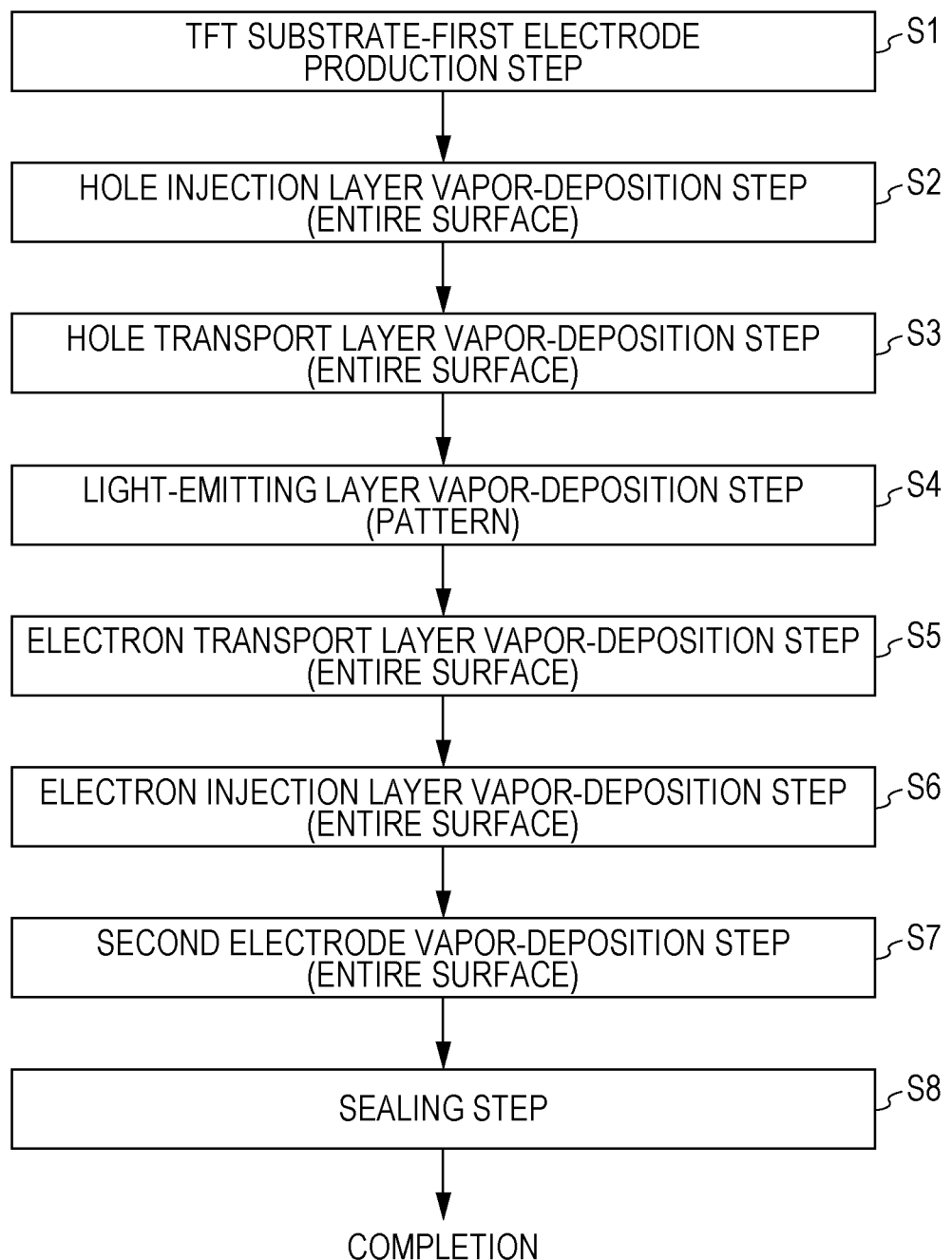
FIG. 9 is a flowchart for illustrating a process for manufacturing the organic EL device in embodiment 1.

FIG. 9 is a flowchart for illustrating a process for manufacturing the organic EL device in embodiment 1.

As shown in FIG. 9, the manufacturing method for the organic EL device in the present embodiment can include a TFT substrate-first electrode production step S1, a hole injection layer vapor-deposition step S2, a hole transport layer vapor-deposition step S3, a light-emitting layer vapor-deposition step S4, an electron transport layer vapor-deposition step S5, an electron injection layer vapor-deposition step S6, a second electrode vapor-deposition step S7, and a sealing step S8.

The hole injection layer vapor-deposition step S2, the hole transport layer vapor-deposition step S3, the electron transport layer vapor-deposition step S5, and the electron injection layer vapor-deposition step S6 may be appropriately omitted according to the layered structure of the organic EL elements 20R, 20G and 20B.

First, components of the TFT substrate 10 such as the TFTs 12, the traces 14, and the interlayer insulating film 13 are formed on the insulating substrate 11 by a commonly used method.

Examples of the insulating substrate 11 include transparent glass substrates and transparent plastic substrates.

Next, a transparent conductive film is formed on the interlayer insulating film 13 by a sputtering method, a vacuum evaporation method, a CVD (Chemical Vapor Deposition) method, a plasma CVD method, or a printing method.

Next, a photoresist is applied to the transparent conductive film and patterned by photolithography, and then the transparent conductive film is etched. Then the photoresist is removed using a resist remover, and the substrate is washed. The first electrodes 21 are thereby formed on the interlayer insulating film 13.

An electrically conductive material having a high work function is preferably used as the material of the transparent conductive film for the first electrodes 21. Specifically, a transparent electrically conductive material such as ITO (Indium Tin Oxide), IZO (Indium Zinc Oxide), or gallium-doped zinc oxide (GZO) can be used. When the organic EL device 1 is of the top emission type, a metal material such as gold (Au), nickel (Ni), or platinum (Pt) may be used as the material of the first electrodes 21.

No particular limitation is imposed on the thickness of the first electrodes 21, and the thickness may be the same as the thickness for general organic EL elements. Specifically, the thickness is preferably 5 nm to 500 nm, more preferably 10 nm to 400 nm, and still more preferably 20 nm to 200 nm.

Next, a photosensitive resin is applied to the insulating substrate 11 so as to cover the first electrodes 21 and is then patterned by photolithography to form the edge cover 15 having the openings 15R, 15G, and 15B.

For example, a photosensitive resin such as a photosensitive acrylic resin or a photosensitive polyimide resin can be used as the material of the edge cover 15.

The TFT substrate 10 and the first electrodes 21 are produced by the above step (the TFT substrate-first electrode production step S1).

Next, the TFT substrate 10 produced through the above step is washed and then subjected to baking under reduced pressure for degassing and to oxygen plasma treatment for cleaning the surface of the first electrodes 21.

Next, the material of the hole injection layer 22 is vapor-deposited over the entire display area using a general vapor deposition device so as to cover the edge cover 15 and the first electrodes 21 to thereby form the hole injection layer 22 (the hole injection layer vapor-deposition step S2).

More specifically, an open mask having an opening formed such that at least the entire display area is exposed is aligned with the TFT substrate 10 and laminated to the TFT substrate 10. While the TFT substrate 10 together with the open mask is rotated, vapor deposition particles flying from an evaporation source are vapor-deposited uniformly over the entire display area through the opening of the open mask.

As used herein, the phrase "vapor deposition or formation of a layer over the entire display area" means that the layer is vapor-deposited or formed continuously over a region containing the entire display area. Therefore, the layer is vapor-deposited or formed also in regions between adjacent sub-pixels.

Next, with the same method as in the hole injection layer vapor-deposition step S2, the material of the hole transport layer 23 is vapor-deposited over the entire display area so as to cover the hole injection layer 22 to thereby form the hole transport layer 23 (the hole transport layer vapor-deposition step S3.

No particular limitation is imposed on the material of the hole injection layer 22 and the material of the hole transport layer 23, and materials for general organic EL elements may be used. Specific examples of such materials include benzine, styrylamine, triphenylamine, porphyrin, triazole, imidazole, oxadiazole, polyarylalkanes, phenylenediamine, arylamines, oxazole, anthracene, fluorenone, hydrazone, stilbene, triphenylene, azatriphenylene, derivatives thereof, polysilane-based compounds, vinylcarbazole-based compounds, and heterocyclic conjugated monomers, oligomers, and polymers such as thiophene-based compounds and aniline-based compounds.

No particular limitation is imposed on the thickness of the hole injection layer 22 and the thickness of the hole transport layer 23, and these thicknesses may be the same as those for general organic EL elements. Specifically, the thicknesses of these layers are preferably 0.1 nm to 500 nm, more preferably 0.3 nm to 300 nm, and still more preferably 0.5 nm to 200 nm.

As described above, the hole injection layer 22 and the hole transport layer 23 may be integrated together or may be formed as independent layers.

Next, the light-emitting layers 24R, 24G, and 24B corresponding to the sub-pixels 2R, 2G, and 2B are formed (into patterns) so as to cover the openings 15R, 15G, and 15B of the edge cover 15 using the gap deposition method or the contact deposition method (the light-emitting layer vapor-deposition step S4). The light-emitting layers 24R, 24G, and 24B are formed separately in a given order.

Figure 10:
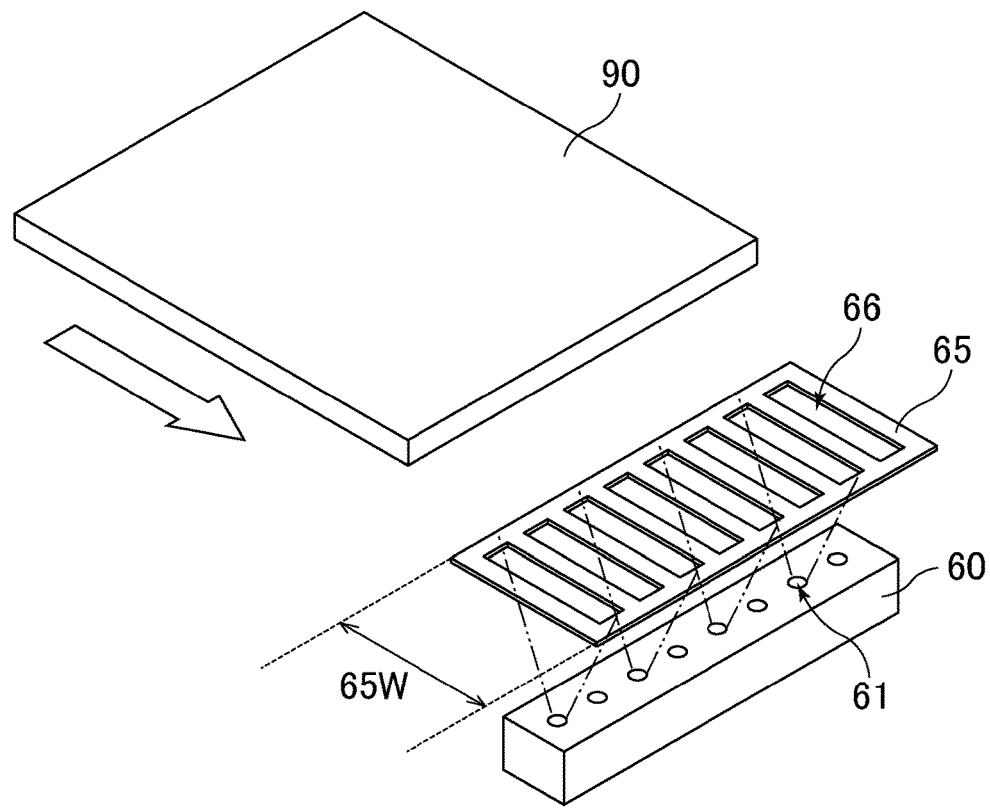
FIG. 10 is a schematic perspective view for illustrating a light-emitting layer vapor-deposition step for the organic EL device in embodiment 1.

FIG. 10 is a schematic perspective view for illustrating the light-emitting layer vapor-deposition step for the organic EL device in embodiment 1.

When the gap deposition method is used, vapor deposition is performed while a substrate (vapor-deposition substrate) 90 is moved (shifted) in a prescribed direction (a direction indicated by a solid white arrow in FIG. 10, this direction may be referred to also as a moving direction) at a constant speed relative to a vapor deposition unit including an evaporation source 60 and a vapor deposition mask 65, as shown in FIG. 10.

The substrate 90 is produced through steps S1, S2, and S3 described above, and the hole transport layer 23 and other layers disposed therebelow have been formed on the insulating substrate 11 as described above.

The evaporation source 60 and the vapor deposition mask 65 are integrated into a single vapor deposition unit. The vapor deposition mask 65 is disposed between the evaporation source 60 and the substrate 90. The vapor deposition mask 65 is disposed so as to be spaced apart from the evaporation source 60. During vapor deposition, the gap between the vapor deposition mask 65 and the evaporation source 60 is maintained to a prescribed size. No particular limitation is imposed on the gap, and the gap may be set to a size used in a general gap deposition method.

To prevent damage to the substrate 90 when the substrate 90 is moved, the substrate 90 is moved with a prescribed gap provided between the substrate 90 and the vapor deposition mask 65. No particular limitation is imposed on the size of the gap, and the gap may be set to a size used in a general gap deposition method. Specifically, the gap is preferably 0.01 mm to 10 mm, more preferably 0.05 mm to 5 mm, and still more preferably 0.1 mm to 2 mm.

The evaporation source 60 is a box-shaped container extending in a direction orthogonal to the moving direction, and a light-emitting material is contained in the container. A plurality of injection holes (openings) 61 are periodically provided in the upper portion of the evaporation source 60. When the evaporation source 60 is heated, the light-emitting material is vaporized, and the vapor diffuses inside the evaporation source 60 and is injected upward from the injection holes 61. A vapor deposition flow, which is the flow of vapor deposition particles, is thereby generated through each of the injection holes 61.

A plurality of openings 66 are formed in the vapor deposition mask 65. Each of the openings 66 has a shape longer in the moving direction and shorter in a direction orthogonal to the moving direction (e.g., a slit shape) and is disposed substantially parallel to the moving direction. Part of the vapor deposition flow arriving at the vapor deposition mask 65 passes through the openings 66 and reaches the substrate 90, and the rest of the vapor deposition flow is blocked by the vapor deposition mask 65. Therefore, the vapor deposition particles are deposited on the substrate 90 so as to form a pattern corresponding to the openings 66 of the vapor deposition mask 65.

Since the vapor deposition mask 65 is smaller than the substrate 90, the vapor deposition mask 65 can be easily manufactured, and the occurrence of bending of the vapor deposition mask 65 due to its own weight can be suppressed. In addition, the width 65W of the vapor deposition mask 65 in the moving direction can be minimized.

In the light-emitting layer vapor-deposition step S4, vapor deposition is performed three times. Each time the vapor deposition is performed, the position of the vapor deposition mask 65 relative to the substrate 90 in a horizontal plane is changed. The first, second, and third light-emitting layers are formed in this order in the manner described above.

Each time the vapor deposition is performed, vapor deposition particles are caused to adhere to the substrate 90 while the substrate 90 is moved (shifted) relative to the vapor deposition unit including the evaporation source 60 etc. to thereby form a stripe pattern, i.e., the first, second, or third light-emitting layer. In this case, the light-emitting material spreads over regions other than the prescribed regions as described above, and the first, second, and third foreign material films are formed simultaneously with the first, second, and third light-emitting layers, respectively.

The first light-emitting layer that is formed first is formed so as to emit light from a portion spaced apart from the upper surface, and a second light-emitting layer that is formed second is formed so as to emit light from a portion spaced apart from the lower surface and from the upper surface. The third light-emitting layer that is formed last is formed so as to emit light from a portion spaced apart from the lower surface. Therefore, light emission of the foreign material films can be suppressed, and the occurrence of color mixing can be suppressed.

With the gap deposition method, the first, second, and third foreign material films can be easily formed by controlling (1) the gap between the vapor deposition mask 65 and the substrate 90, (2) the spread area (angle) of the vapor deposition flow, (3) the rate of deposition, (4) the pitch of the sub-pixels, and (5) the rigidity of the vapor deposition mask 65. The formation of the foreign material films is facilitated when (1) to (3) described above are increased and when (4) and (5) described above are reduced.

As for (1) above, when the distance between the vapor deposition mask 65 and the substrate 90 increases, vapor deposition particles flying at an oblique angle with respect to the normal to the vapor deposition mask 65 (a line perpendicular to the principal surface of the mask 65) pass through the openings of the vapor deposition mask 65 and are then deposited on portions apart from the prescribed portions, and a pattern wider than the prescribed pattern is formed on the substrate 90. Therefore, as the distance of the vapor deposition mask 65 from the substrate 90 increases, the formation of the foreign material film is facilitated. As the distance of the vapor deposition mask 65 from the substrate 90 decreases, the formation of the foreign material film is suppressed. As for (2) above, when the spread area (angle) of the vapor deposition flow is large, vapor deposition particles are deposited on regions outside the prescribed sub-pixels, and the area in which the foreign material film is formed increases. As for (3) above, as the rate of deposition increases, the amount of the vapor deposition particles increases, and the degree of scattering of the vapor deposition particles increases, so that the formation of the foreign material film is more facilitated. As for (4) above, as the pitch of the sub-pixels decreases, the distance between a given sub-pixel and its adjacent sub-pixel decreases, and a foreign material film is more likely to be formed on the adjacent sub-pixel. As for (5) above, when the rigidity of the vapor deposition mask 65 is small, the bending of the vapor deposition mask 65 becomes large. In this case, vapor deposition particles flying obliquely with respect to the normal to the vapor deposition mask 65 are deposited over a wider area, and a foreign material film is formed over a wider range. Therefore, the formation of the foreign material film is facilitated.

More specifically, as for (1) above, when the distance between the vapor deposition mask 65 and the substrate 90 is 1 mm or less, the formation of the foreign material film is less likely to occur. However, when the distance is larger than 1 mm, the formation of the foreign material film is facilitated. Particularly, when the distance is 2 mm or more, the formation of the foreign material film becomes significant. As for (2) above, when the spread angle of the vapor deposition flow is 20° or more, it is fundamentally difficult to avoid the formation of the foreign material film. As for (3) above, when the rate of deposition is 5 Å/sec or less, the formation of the foreign material film is less likely to occur. However, when the rate of deposition is higher than 5 Å/sec, the formation of the foreign material film occurs considerably. As for (4) above, when a resolution of 100 ppi or lower is used, the size of the pixels is large enough, and the foreign material film does not cause serious problems. However, when the resolution is higher than 100 ppi, the foreign material film causes a problem. As for (5) above, generally, when the rigidity of the vapor deposition mask 65 is less than 10 GPa, an abnormal film causes a problem. However, when the rigidity is 10 GPa or more, the foreign material film causes almost no problem.

During vapor deposition, one of the substrate 90 and the vapor deposition unit including the evaporation source 60 and the vapor deposition mask 65 may be fixed, and the other may be moved. Alternatively, both of them may be moved.

Figure 11:
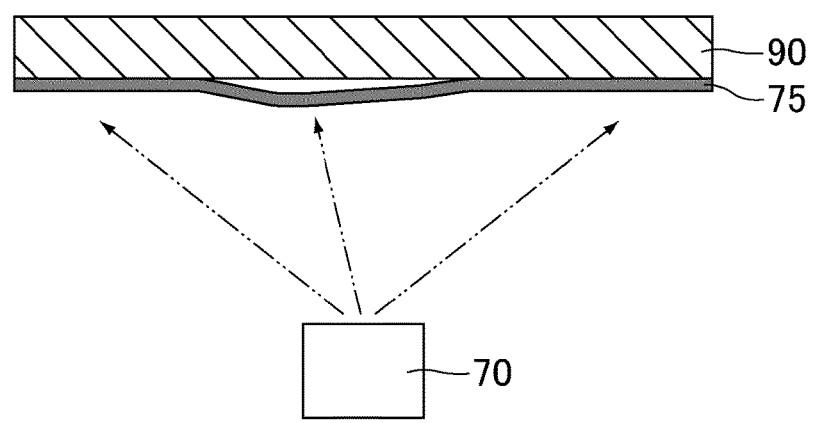
FIG. 11 is a schematic cross-sectional view for illustrating the light-emitting layer vapor-deposition step for the organic EL device in embodiment 1.

FIG. 11 is a schematic cross-sectional view for illustrating the light-emitting layer vapor-deposition step for the organic EL device in embodiment 1.

When the contact deposition method is used, vapor deposition is performed while the substrate 90 and a vapor deposition mask 75 disposed above an evaporation source 70 are rotated in a horizontal plane as shown in FIG. 11.

The vapor deposition mask 75 is disposed between the evaporation source 70 and the substrate 90, and the vapor deposition mask 75 is spaced apart from the evaporation source 70. During vapor deposition, the gap between the vapor deposition mask 75 and the evaporation source 70 is maintained to a prescribed size. No particular limitation is imposed on the gap, and the gap may be set to a size used in a general contact deposition method.

The vapor deposition mask 75 is disposed such that at least part of the vapor deposition mask 75 is in contact with the substrate 90. However, a gap is partially formed between the vapor deposition mask 75 and the substrate 90 because of bending of the vapor deposition mask 75 by its own weight, distortion of the vapor deposition mask 75, etc.

The evaporation source 70 is a container having an open upper portion, and a light-emitting material is contained in the evaporation source 70. When the evaporation source 70 is heated, the light-emitting material is vaporized, and the vapor flows upward, so that a vapor deposition flow, which is the flow of vapor deposition particles, is generated.

A plurality of openings (not shown) arranged in the pattern of the light-emitting layer 24R, 24G, or 24B, i.e., a slit-like pattern, are formed in the vapor deposition mask 75. Part of the vapor deposition flow arriving at the vapor deposition mask 75 passes through the openings and reaches the substrate 90, and the rest of the vapor deposition flow is blocked by the vapor deposition mask 75. Therefore, the vapor deposition particles are deposited on the substrate 90 so as to form a pattern corresponding to the openings of the vapor deposition mask 75.

The size of the vapor deposition mask 75 is substantially the same as the size of the substrate 90, and it is difficult to reduce the vapor deposition mask 75 in size. Therefore, as described above, the vapor deposition mask 75 is easily bent by its own weight and is easily distorted.

In the light-emitting layer vapor-deposition step S4, vapor deposition is performed three times. Each time the vapor deposition is performed, the position of the vapor deposition mask 75 relative to the substrate 90 in a horizontal plane is changed. The light-emitting layers 24R, 24G, and 24B of three colors are formed sequentially in the manner described above.

Each time the vapor deposition is performed, vapor deposition particles are caused to adhere to the substrate 90 while the substrate 90 and the vapor deposition mask 75 are rotated in a horizontal plane to thereby form a stripe pattern, i.e., the light-emitting layer 24R, 24G, or 24B. In this case, since a gap is partially formed between the vapor deposition mask 75 and the substrate 90, the light-emitting material spreads over regions other than the prescribed regions as described above, and the first, second, and third foreign material films are also formed.

The first light-emitting layer that is formed first is formed so as to emit light from a portion spaced apart from the upper surface, and a second light-emitting layer that is formed second is formed so as to emit light from a portion spaced apart from the lower surface and from the upper surface. The third light-emitting layer that is formed last is formed so as to emit light from a portion spaced apart from the lower surface. Therefore, light emission of the foreign material films can be suppressed, and the occurrence of color mixing can be suppressed.

With the contact deposition method, the first, second, and third foreign material films can be easily formed by controlling (1) the size of the vapor deposition mask 75, (2) the weight of the vapor deposition mask 75, (3) the spread area (angle) of the vapor deposition flow, (4) the rate of deposition, (5) the pitch of the sub-pixels, and (6) the rigidity of the vapor deposition mask 75. The formation of the foreign material films is facilitated when (1) to (4) described above are increased and when (5) and (6) described above are reduced.

High-light emission efficiency light-emitting materials such as low-molecular weight fluorescent dyes and metal complexes are preferred as the materials of the light-emitting layers 24R, 24G, and 24B.

A light-emitting material having electron transport capability, a light-emitting material having bipolar capability, and a light-emitting material having hole transport capability are used as the materials of the first, second, and third light-emitting layers, respectively.

No particular limitation is imposed on the light-emitting material having electron transport capability, the light-emitting material having bipolar capability, and the light-emitting material having hole transport capability, and materials for general organic EL elements may be used. Specific examples of the light-emitting material having electron transport capability include $Alq_3$ (tris(8-hydroxyquinoline) aluminum, green light emission). Examples of the light-emitting material having bipolar capability include CBP (4,4'-N,N'-dicarbazole-biphenyl) doped with $Ir(ppy)_3$ (green light emission). Examples of the light-emitting material having hole transport capability include PVK (poly(vinylcarbazole), blue light emission), PVK doped with TPB (1,1,4,4-tetraphenyl-1, 3-butadiene) (blue light emission), PVK doped with coumarin 6 (green light emission), and PVK doped with DCM1 (4-(dicyanomethylene)-2-methyl-6-(4-dimethylaminostyryl)-4H-pyran) (red light emission).

No particular limitation is imposed on the thickness of each of the light-emitting layers 24R, 24G, and 24B, and the thickness may be the same as that for general organic EL elements. Specifically, the thickness of each layer is preferably 5 nm to 200 nm, more preferably 10 nm to 100 nm, and still more preferably 20 nm to 60 nm.

Next, with the same method as in the hole injection layer vapor-deposition step S2, the material of the electron transport layer 25 is vapor-deposited over the entire display area so as to cover the hole transport layer 23 and the first, second, and third light-emitting layers to thereby form the electron transport layer 25 (the electron transport layer vapor-deposition step S5).

No particular limitation is imposed on the material of the electron transport layer 25, and a material for general organic EL elements may be used. Specific examples of such a material include quinoline, perylene, phenanthroline, bisstyryl, pyrazine, triazole, oxazole, oxadiazole, fluorenone, derivatives thereof, and metal complexes thereof.

More specific examples include $Alq_3$ (tris(8-hydroxyquinoline)aluminum), anthracene, naphthalene, phenanthrene, pyrene, perylene, butadiene, coumalin, acridine, stilbene, 1,10-phenanthroline, derivatives thereof, and metal complexes thereof.

No particular limitation is imposed on the thickness of the electron transport layer 25, and the thickness may be the same as that for general organic EL elements. Specifically, the thickness is preferably 1 nm to 500 nm, more preferably 5 nm to 100 nm, and still more preferably 10 nm to 50 nm.

Next, with the same method as in the hole injection layer vapor-deposition step S2, the material of the electron injection layer is vapor-deposited over the entire display area so as to cover the electron transport layer 25 to thereby form the electron injection layer (the electron injection layer vapor-deposition step S6).

No particular limitation is imposed on the material of the electron injection layer, and a material for general organic EL elements may be used. Specific examples of such a material include: oxides and fluorides of alkali metals; and oxides and fluorides of alkaline-earth metals. More specific examples include LiF.

No particular limitation is imposed on the thickness of the electron injection layer, and the thickness may be the same as that for general organic EL elements. Specifically, the thickness of the electron injection layer is preferably 0.1 nm to 50 nm, more preferably 0.1 nm to 20 nm, and still more preferably 0.3 nm to 10 nm.

The electron transport layer 25 and the electron injection layer may be integrated together as described above or may be formed as independent layers.

Next, with the same method as in the hole injection layer vapor-deposition step S2, the material of the second electrode 26 is vapor-deposited over the entire display area so as to cover the electron injection layer to thereby form the second electrode 26 (the second electrode vapor-deposition step S7). The organic EL elements 20R, 20G and 20B are thereby formed on the TFT substrate 10.

A metal having a low work function is preferably used as the material of the second electrode 26. Specific examples of such a material include: magnesium alloys such as MgAg; aluminum alloys such as AlLi, AlCa, and AlMg; and metal calcium.

No particular limitation is imposed on the thickness of the second electrode 26, and the thickness may be the same as that for general organic EL elements. Specifically, the thickness is preferably 1 nm to 500 nm, more preferably 5 nm to 200 nm, and still more preferably 10 nm to 100 nm.

Next, the TFT substrate 10 with the organic EL elements 20R, 20G and 20B formed thereon and the sealing substrate 42 with the desiccant 43 affixed thereto are bonded using the sealing resin 41 to seal the organic EL elements 20R, 20G and 20B.

Cut glass is used for the sealing substrate 42, and the sealing resin 41 is disposed in a frame shape so as to be in contact with the circumferential edges of the cut glass.

The method for sealing the organic EL elements 20R, 20G and 20B is not particularly limited to the above-described method, and any other sealing method can be used. Other examples of the sealing method include a method in which a resin is filled into the space between the TFT substrate 10 and a flat sealing substrate 42.

To more effectively prevent oxygen and water from entering the organic EL elements 20R, 20G and 20B from the outside, a protective film (not shown) may be formed so as to cover the second electrode 26.

The protective film may be formed from an insulating or electrically conductive material. Examples of such a material include silicon nitride and silicon oxide.

The organic EL device 1 is completed through the above-described steps. With the organic EL device manufacturing method in the present embodiment, an organic EL device in which the occurrence of color mixing can be suppressed, i.e., a display with high color purity and high display quality, can be realized. The organic EL device manufacturing method in the present embodiment is suitable for a manufacturing method for the organic EL device 1 in the present embodiment.

In the present embodiment, when at least one of the first, second, and third light-emitting layers emits light from any of the above-described portions, the occurrence of color mixing can be suppressed in organic EL elements including the at least one light-emitting layer. Therefore, it is not always necessary that all the light-emitting layers emit light from the above-described portions. However, from the viewpoint of effectively suppressing color mixing, it is preferable that the first, second, and third light-emitting layers emit light from the above-described portions.

The organic EL device in the present embodiment may be of the top emission type.

The organic EL device in the present embodiment was actually manufactured, and its characteristics were evaluated. The results are shown below.

Example 1

First, the edge cover and other layers disposed therebelow were formed on a glass substrate using known methods. The first electrodes serving as anodes were formed by patterning an indium zinc oxide (IZO) film having a thickness of 70 nm.

Next, the substrate with the edge cover formed thereon was washed, then held in an oven at 200° C. in a nitrogen atmosphere at atmospheric pressure for 1 hour, and heated at 200° C. in a vacuum for 2 hours.

Next, the surface of the substrate was treated with UV/O$_3$ (ultraviolet rays/ozone).

Then, elements of the organic EL layers were formed. All the elements were formed in a high vacuum of $10^{-3}$ Pa or lower by a vapor deposition method.

First, LG-101 (manufactured by LG Chem, Ltd.) was vapor-deposited over the entire display area to form a 30 nm-thick hole injection layer in a solid pattern over the entire region including at least the entire display area (i.e., to form a continuous hole injection layer). The rate of deposition was fixed at 1 Å/sec, and the temperature of a crucible was within the range of 200° C. to 400° C. A plurality of similar experiments were performed. However, since the conditions of the experiments such as the amount of the material fed were different for each experiment, the temperature of the crucible varied within the above range for each experiment.

Next, NPB (N,N-di(naphthalene-1-yl)-N,N-diphenyl-benzidene) was vapor-deposited over the entire display area to form a 10 nm-thick hole transport layer in a solid pattern over the entire region including at least the entire display area. The rate of deposition was fixed at 1 Å/sec, and the temperature of a crucible was within the range of 200° C. to 400° C. A plurality of similar experiments were performed. However, since the conditions of the experiments such as the amount of the material fed were different for each experiment, the temperature of the crucible varied within the above range for each experiment.

Next, a description will be given of a method for forming the light-emitting layers. All the light-emitting layers were formed using a vapor deposition mask in which a plurality of stripe-shaped openings were formed.

First, Alq$_3$ (tris(8-quinolinolato)aluminum) having electron transport capability was used as a host material, and DCM2 was used as a doping material. These materials were co-vapor deposited on the substrate to form a 40 nm-thick light-emitting layer (red) having electron transport capability as the first light-emitting layer. Commercial products were used for these materials. The concentration of the dopant was 5% of the total thickness of the light-emitting layer. The rate of deposition of the host material was fixed at 1 Å/sec, and the rate of deposition of the dopant was fixed at 0.05 Å/sec. The temperatures of the crucibles for these materials were within the range of 200° C. to 400° C. A plurality of similar experiments were performed. However, since the conditions of the experiments such as the amounts of the materials fed were different for each experiment, the temperatures of the crucibles varied within the above range for each experiment.

Next, CBP having bipolar charge transport capability was used as a host material, and Ir(ppy)$_3$ was used as a doping material. These materials were co-vapor deposited on the substrate to form a 40 nm-thick light-emitting layer (green) having bipolar charge transport capability as the second light-emitting layer. Commercial products were used for these materials. The concentration of the dopant was 5% of the total thickness of the light-emitting layer. The rate of deposition of the host material was fixed at 1 Å/sec, and the rate of deposition of the dopant was fixed at 0.05 Å/sec. The temperatures of the crucibles for these materials were within the range of 200° C. to 400° C. A plurality of similar experiments were performed. However, since the conditions of the experiments such as the amounts of the materials fed were different for each experiment, the temperatures of the crucibles varied within the above range for each experiment.

Then diphenylamino benzodifuran (DPABDF) was used as a host material, tetrafluorotetracyanoquinodimethane (TCNQF4) was used as an acceptor, and tris(2-phenylpyridine)iridium (III) (Ir(ppy)$_3$) was used as a light-emitting dopant. These materials were co-vapor deposited on the substrate to form a 35 nm-thick light-emitting layer (blue) having hole transport capability as the third light-emitting layer. The concentration of the acceptor was 20% of the total thickness of the light-emitting layer, and the concentration of the dopant was 5% of the total thickness of the light-emitting layer. The rate of deposition of the host material was fixed at 1 Å/sec, the rate of deposition of the acceptor was fixed at 0.27 Å/sec, and the rate of deposition of the dopant was fixed at 0.07 Å/sec. The temperatures of the crucibles for these materials were within the range of 200° C. to 400° C. A plurality of similar experiments were performed. However, since the conditions of the experiments such as the amounts of the materials fed were different for each experiment, the temperatures of the crucibles varied within the above range for each experiment.

Next, TR-E314 (manufactured by TORAY INDUSTRIES Inc.) was vapor-deposited over the entire display area to form a 20 nm-thick electron transport layer in a solid pattern over the entire region containing at least the entire display area. The rate of deposition was fixed at 1 Å/sec, and the temperature of a crucible was within the range of 200° C. to 400° C. A plurality of similar experiments were performed. However, since the conditions of the experiments such as the amount of the material fed were different for each experiment, the temperature of the crucible varied within the above range for each experiment.

Next, lithium fluoride (LiF) was vapor-deposited over the entire display area to form a 0.5 nm-thick electron injection layer in a sold pattern over the entire region containing at least the entire display area. The rate of deposition was fixed at 0.01 Å/sec, and the temperature of a crucible was within the range of 200° C. to 400° C. A plurality of similar experiments were performed. However, since the conditions of the experiments such as the amount of the material fed were different for each experiment, the temperature of the crucible varied within the above range for each experiment.

Next, aluminum (Al) used as the second electrode serving as a cathode was formed to a thickness of 100 nm over the entire display area.

Finally, the organic EL elements were sealed using a known method.

In this Example, a bottom emission structure in which light emitted is extracted through the glass substrate was used.

Example 2

An organic EL device in this Example was produced in the same manner as in Example 1 except that the first light-emitting layer, the second light-emitting layer, and the third light-emitting layer were different from those in Example 1. In this Example, all the light-emitting layers were formed using materials having electron transport capability.

NS60 (manufactured by Nippon Steel Chemical Co., Ltd.) having electron transport capability was used as a host material, and RD26 (manufactured by UDC) was used as a dopant. These materials were co-vapor deposited on the substrate to form a 25 nm-thick light-emitting layer (red) having electron transport capability as the first light-emitting layer. The concentration of the dopant was 4% of the total thickness of the light-emitting layer. The rate of deposition of the host material was fixed at 1 Å/sec, and the rate of deposition of the dopant was fixed at 0.04 Å/sec. The temperatures of the crucibles for these materials were within the range of 250° C. to 350° C. A plurality of similar experiments were performed. However, since the conditions of the experiments such as the amounts of the materials fed were different for each experiment, the temperatures of the crucibles varied within the above range for each experiment.

Next, NS60 (manufactured by Nippon Steel Chemical Co., Ltd.) having electron transport capability was used as a host material, and GD48 (manufactured by UDC) was used as a dopant. These materials were co-vapor deposited on the substrate to form a 30 nm-thick light-emitting layer (green) having electron transport capability as the second light-emitting layer. The concentration of the dopant was 20% of the total thickness of the light-emitting layer. The rate of deposition of the host material was fixed at 0.8 Å/sec, and the rate of deposition of the dopant was fixed at 0.2 Å/sec. The temperatures of the crucibles for these materials were within the range of 250° C. to 350° C. A plurality of similar experiments were performed. However, since the conditions of the experiments such as the amounts of the materials fed were different for each experiment, the temperatures of the crucibles varied within the above range for each experiment.

BH232 (manufactured by Idemitsu Kosan Co., Ltd.) having electron transport capability was used as a host material, and BD310 (manufactured by Idemitsu Kosan Co., Ltd.) was used as a dopant. These materials were co-vapor deposited on the substrate to form a 30 nm-thick light-emitting layer (blue) having electron transport capability as the third light-emitting layer. The concentration of the dopant was 7.5% of the total thickness of the light-emitting layer. The rate of deposition of the host material was fixed at 1 Å/sec, and the rate of deposition of the dopant was fixed at 0.075 Å/sec. The temperatures of the crucibles for these materials were within the range of 250° C. to 350° C. A plurality of similar experiments were performed. However, since the conditions of the experiments such as the amounts of the materials fed were different for each experiment, the temperatures of the crucibles varied within the above range for each experiment.

The characteristics of Examples 1 and 2 will next be described.

Figure 12:
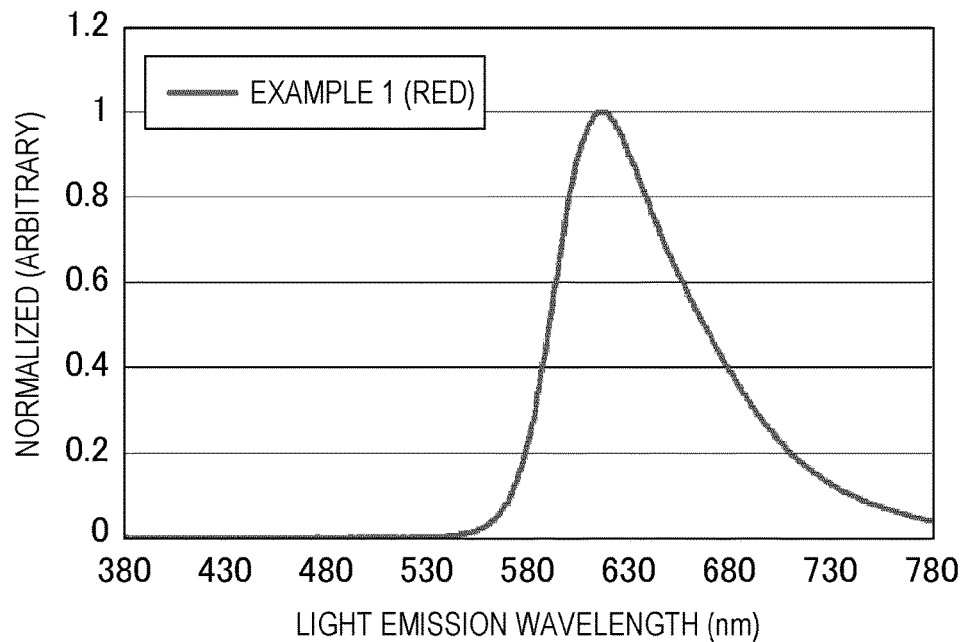
FIG. 12 shows the light emission spectrum of an organic EL element included in an organic EL device in Example 1.
Figure 13:
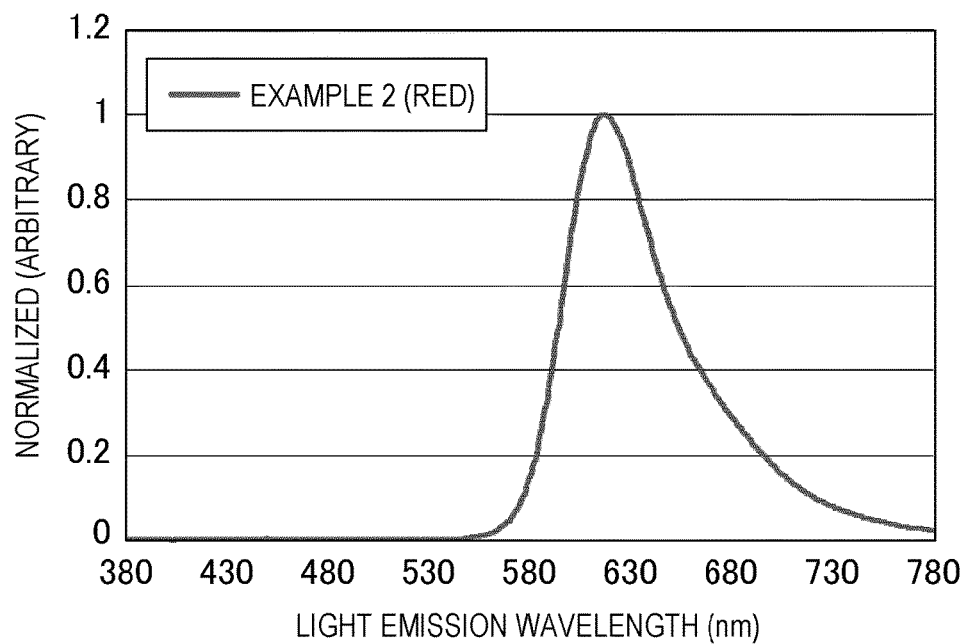
FIG. 13 shows the light emission spectrum of an organic EL element included in an organic EL device in Example 2.

FIGS. 12 and 13 show light emission spectra of organic EL elements included in the organic EL devices in Examples 1 and 2.

In each of Examples 1 and 2, the first light-emitting layer has electron transport capability. Therefore, as shown in FIGS. 12 and 13, no color mixing occurred, and the intended light-emitting color could be obtained. This may be because of the following reason. In Examples 1 and 2, the light-emitting position is present at the boundary between the first light-emitting layer and the hole transport layer, and the first light-emitting layer emits light from a portion spaced apart from the upper surface of the first light-emitting layer on which the second and third foreign material films can be present.

Figure 14:
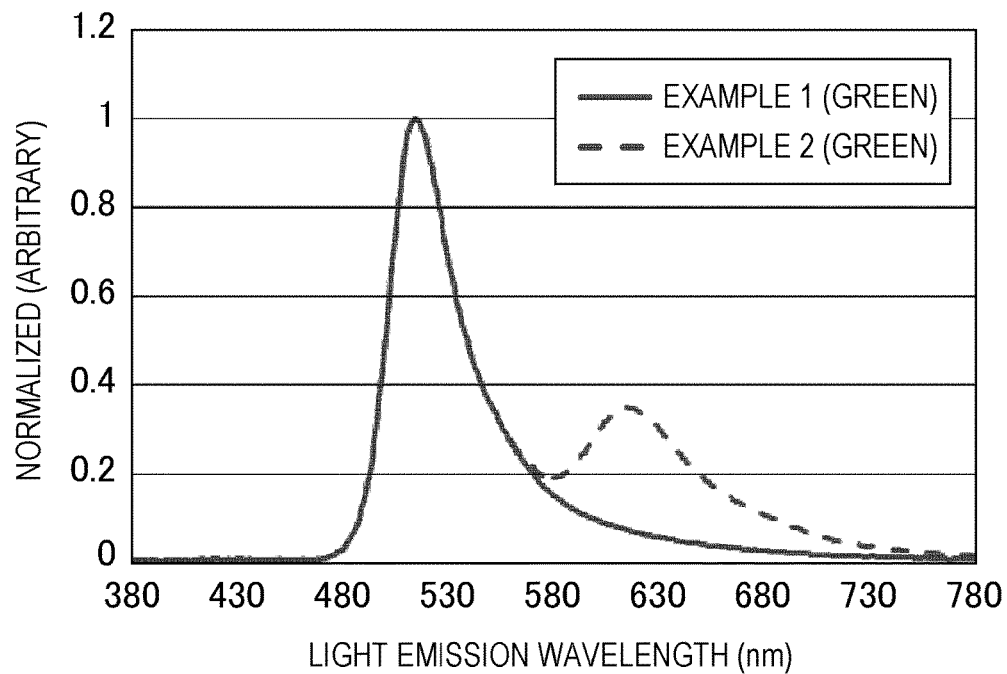
FIG. 14 shows the light emission spectra of organic EL elements included in the organic EL devices in Examples 1 and 2.
Figure 15:
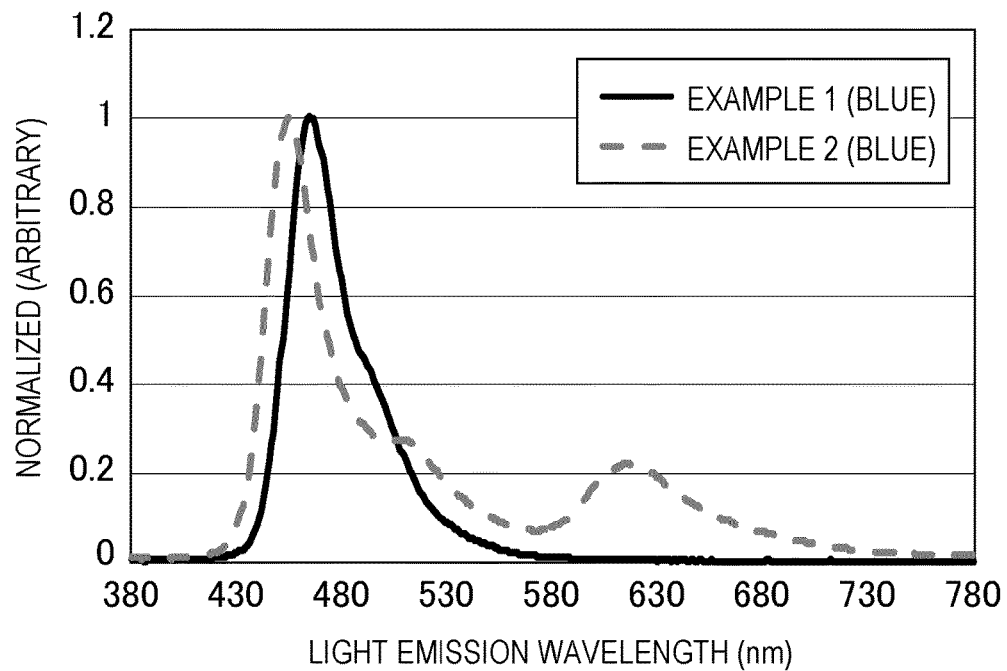
FIG. 15 shows the light emission spectra of organic EL elements included in the organic EL devices in Examples 1 and 2.

FIGS. 14 and 15 show light emission spectra of organic EL elements included in the organic EL devices in Examples 1 and 2.

As shown in FIG. 14, in Example 2, the second light-emitting layer includes a spectrum component (red) other than the intended light-emitting color. However, in Example 1, such a component is not present. Therefore, the occurrence of color mixing could be prevented, and the intended light-emitting color could be obtained. The above results indicate the following. In Example 2, the first foreign material film containing the red light-emitting material is considered to be present below the second light-emitting layer. Since the second light-emitting layer has electron transport capability, the light-emitting position is considered to be present in the vicinity of the lower surface of the second light-emitting layer. However, in Example 1, the light-emitting position is considered to be present in a portion spaced apart from the upper and lower surfaces of the second light-emitting layer, and the second light-emitting layer is considered to emit light from a portion spaced apart from the lower and upper surfaces of the second light-emitting layer on which the first and third foreign material films can be present. This is because the second light-emitting layer has bipolar charge transport capability.

As shown in FIG. 15, in Example 2, the third light-emitting layer includes spectrum components (red and blue) other than the intended light-emitting color. However, in Example 1, such components are not present. Therefore, the occurrence of color mixing could be prevented, and the intended light-emitting color could be obtained. The above results indicate the following. In Example 2, the first and second foreign material films containing the red and green light-emitting materials, respectively, are considered to be present below the third light-emitting layer. Since the third light-emitting layer has electron transport capability, the light-emitting position is considered to be present in the vicinity of the lower surface of the third light-emitting layer. However, in Example 1, the light-emitting position is present at the boundary between the third light-emitting layer and the electron transport layer, and the third light-emitting layer is considered to emit light from a portion spaced apart from the lower surface of the third light-emitting layer on which the first and second foreign material films can be present. This is because the third light-emitting layer has hole transport capability.

In Examples 1 and 2, different light-emitting materials are used, so that the peak positions of the light emission spectra are different.

Embodiment 2

The present embodiment is substantially the same as embodiment 1 except that the organic EL elements have layered structures different from those in embodiment 1. Therefore, in the present embodiment, features specific to the present embodiment will mainly be described, and description of the same features as in embodiment 1 will be omitted. In the present embodiment and embodiment 1, the components having the same or similar functions are denoted by the same symbols, and the description of these components will be omitted.

Figure 16:
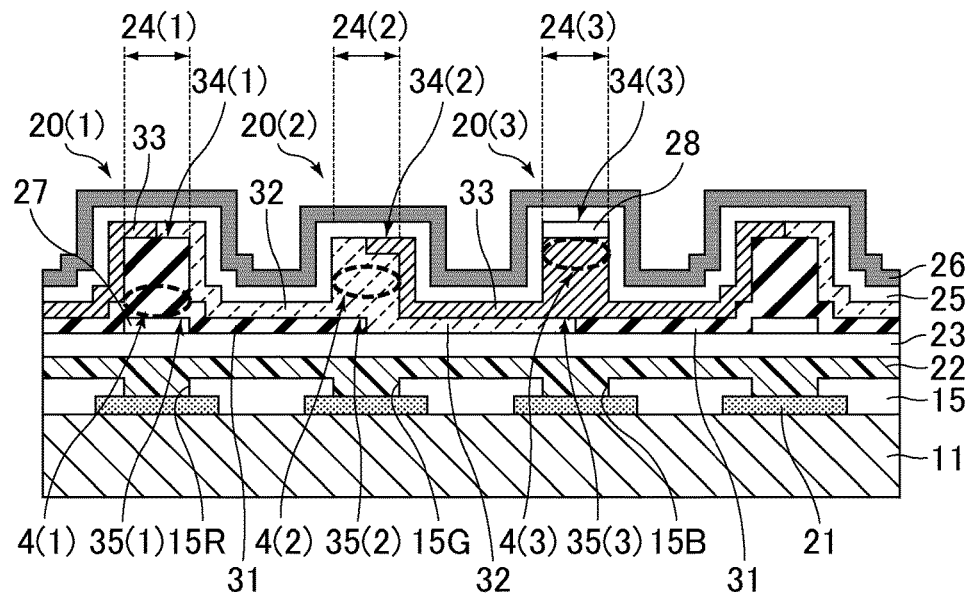
FIG. 16 is a schematic cross-sectional view of an organic EL device in embodiment 2.

FIG. 16 is a schematic cross-sectional view of an organic EL device in embodiment 2. The organic EL device in the present embodiment can correspond to the organic electroluminescent device according to the twelfth aspect described above.

In the present embodiment, to control the light-emitting positions of the light-emitting layers, a method in which charge blocking layers are added is used. Specifically, as shown in FIG. 16, the first organic EL element 20(1) including the first light-emitting layer 24(1) further includes an electron blocking layer 27. The electron blocking layer 27 is a layer having electron blocking capability and hole transport capability. The electron blocking layer 27 is formed selectively in the first organic EL element 20(1), and the second and third organic EL elements 20(2) and 20(3) including the second and third light-emitting layers 24(2) and 24(3), respectively, include no electron blocking layer. The first organic EL element 20(1) including the electron blocking layer 27 can correspond to the organic electroluminescent element V described above.

The third organic EL element 20(3) including the third light-emitting layer 24(3) further includes a hole blocking layer 28. The hole blocking layer 28 is a layer having hole blocking capability and electron transport capability. The hole blocking layer 28 is formed selectively in the third organic EL element 20(3), and the first and second organic EL elements 20(1) and 20(2) include no hole blocking layer. The third organic EL element 20(3) including the hole blocking layer 28 can correspond to the organic electroluminescent element X described above.

In addition to the electron blocking layer 27 and the hole blocking layer 28, the first organic EL element 20(1) includes the hole transport layer 23, and the third organic EL element 20(3) includes the electron transport layer 25, as in embodiment 1. These charge transport layers other than the electron blocking layer 27 and the hole blocking layer 28 do not have charge blocking capability. Specifically, the hole transport layer 23 and the electron transport layer 25 do not have electron blocking capability and hole blocking capability, respectively.

Figure 17:
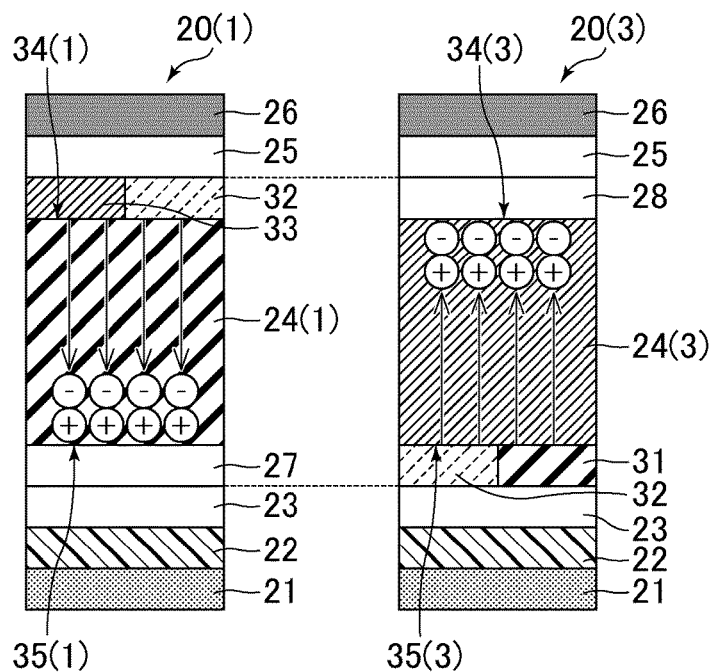
FIG. 17 show schematic cross-sectional views of organic EL elements included in the organic EL device in embodiment 2.

FIG. 17 show schematic cross-sectional views of organic EL elements included in the organic EL device in embodiment 2.

As shown in FIG. 17, in the first organic EL element 20(1), electrons flowing from the second electrode 26 serving as a cathode are blocked by the electron blocking layer 27 and concentrated at the boundary between the electron blocking layer 27 and the first light-emitting layer 24(1) and/or in the vicinity of the boundary. Therefore, the electrons and holes can be recombined at the boundary between the electron blocking layer 27 and the first light-emitting layer and/or in the vicinity of the boundary, and this allows the first light-emitting layer 24(1) to emit light from this portion. This can suppress light emission of the second and third foreign material films 32 and 33, and the occurrence of color mixing can be suppressed.

In the third organic EL element 20(3), holes flowing from the first electrode 21 serving as an anode are blocked by the hole blocking layer 28 and concentrated at the boundary between the hole blocking layer 28 and the third light-emitting layer 24(3) and/or in the vicinity of the boundary. Therefore, electrons and the holes can be recombined at the boundary between the hole blocking layer 28 and the third light-emitting layer 24(3) and/or in the vicinity of the boundary, and this allows the third light-emitting layer 24(3) to emit light from this portion. Therefore, light emission of the first and second foreign material films 31 and 32 can be suppressed, and the occurrence of color mixing can be suppressed.

In addition, in the first organic EL element 20(1), electrons are prevented from passing through the first light-emitting layer 24(1) without recombination with holes. In the third organic EL element 20(3), holes are prevented from passing through the third light-emitting layer 24(3) without recombination with electrons. The electron and holes can thereby be recombined efficiently, and an improvement in brightness can be achieved.

No particular limitation is imposed on the charge transport capability of the first and third light-emitting layers 24(1) and 24(3), and each of the first and third light-emitting layers 24(1) and 24(3) may have electron transport capability, hole transport capability, or bipolar capability. A light-emitting layer having electron transport capability need not necessarily allow no holes to flow at all, and a light-emitting layer having hole transport capability need not necessarily allow no electrons to flow at all. The light-emitting layer having electron transport capability is a light-emitting layer through which electrons can flow more easily than holes, and the light-emitting layer having hole transport capability is a light-emitting layer through which holes can flow more easily than electrons. Not all the charges flowing through a light-emitting layer contribute to light emission, and some charges simply pass through the light-emitting layer. Therefore, irrespective of the charge transport capability of the first light-emitting layer 24(1), electrons flowing in the first light-emitting layer 24(1) are blocked by the electron blocking layer 27 and concentrated at the boundary between the electron blocking layer 27 and the first light-emitting layer 24(1) and/or in the vicinity of the boundary, and recombination occurs in this portion. Irrespective of the charge transport capability of the third light-emitting layer 24(3), holes flowing in the third light-emitting layer 24(3) are blocked by the hole blocking layer 28 and concentrated at the boundary between the hole blocking layer 28 and the third light-emitting layer 24(3) and/or in the vicinity of the boundary, and recombination occurs in this portion.

In the organic EL element 20(2) including the second light-emitting layer 24(2), the second light-emitting layer 24(2) contains the light-emitting material having bipolar capability, as in embodiment 1. The occurrence of color mixing can thereby be suppressed.

Each foreign material film is distinguished from its corresponding light-emitting layer. However, each foreign material film and its corresponding light-emitting layer may be considered as a single light-emitting layer containing the same light-emitting material. In this case, in the present embodiment, a plurality of light-emitting layers that emit light of different colors and are adjacent to each other are disposed such that at least part (e.g., an edge portion) of each light-emitting layer overlaps a light-emitting layer that emits light of a different color. The electron blocking layer is disposed below the lower surface of a lower light-emitting layer among the plurality of light-emitting layers overlapping each other. The hole blocking layer is disposed above the upper surface of an upper light-emitting layer among the plurality of light-emitting layers overlapping each other. Above the lower light-emitting layer, other light-emitting layers are disposed in an overlapping manner. However, since the electron blocking layer is disposed below the lower surface of the lower light-emitting layer, light emission from the portions overlapping the lower light-emitting layer can be suppressed. Below the upper light-emitting layer, other light-emitting layers are present. However, since the hole blocking layer is disposed above the upper surface of the upper light-emitting layer, light emission from the portions present below the upper light-emitting layer can be suppressed.

The organic EL device in the present embodiment can be produced in the same manner as that for the organic EL device in embodiment 1 except that the step of vapor-depositing the electron blocking layer 27 and the step of vapor-depositing the hole blocking layer 28 are added.

The electron blocking layer 27 and the hole blocking layer 28 can be formed using the vapor deposition masks for forming the first and third light-emitting layers, respectively. The electron blocking layer 27 and the hole blocking layer 28 can thereby be formed into the same patterns as those of the first and third light-emitting layers, respectively.

The organic EL device in the present embodiment was actually manufactured, and its characteristics were evaluated. The results are shown below.

Example 3

An organic EL device in this Example was produced in the same manner as in Example 2 except that the electron blocking layer and the hole blocking layer were additionally formed. Specifically, in this Example, all the light-emitting layers were formed using materials having electron transport capability.

First, the same procedure as in Example 1 was repeated until the hole transport layer vapor-deposition step. Then NPB (N,N-di(naphthalene-1-yl)-N,N-diphenyl-benzidene) was vapor-deposited over the entire display area to form a 10 nm-thick hole transport layer in a solid pattern over the entire region including at least the entire display area. The NPB has hole transport capability but has no electron blocking capability.

Next, the step of vapor-depositing the electron blocking layer was performed using the vapor deposition mask for the first light-emitting layer. Specifically, triphenyldiamine (TPD) having electron blocking capability was vapor-deposited on the substrate to form a 10 nm-thick electron blocking layer. The rate of deposition was fixed at 1 Å/sec, and the temperature of a crucible was within the range of 125° C. to 150° C.

Next, the first, second, and third light-emitting layers were formed in the same manner as in Example 2.

Next, the step of vapor-depositing the hole blocking layer was performed using the vapor deposition mask for the third light-emitting layer. Specifically, NS60 (manufactured by Nippon Steel Chemical Co., Ltd.) having hole blocking capability was vapor-deposited on the substrate to form a 10 nm-thick hole blocking layer. The rate of deposition was fixed at 1 Å/sec, and the temperature of a crucible was within the range of 250° C. to 300° C.

In Example 2, NS60 is used as the host material for the first and second light-emitting layers. In this Example, the third light-emitting layer is doped with the guest material, so that the apparent HOMO level at the boundary between the third light-emitting layer and the hole blocking layer is higher than the HOMO level of the host material. Therefore, when a layer composed only of the host material not doped with the guest material is formed on the third light-emitting layer, this layer can have hole blocking capability and can function as a hole blocking layer.

Then the same procedure as in Example 1 was repeated to complete the organic EL device in this Example.

As described above, in this Example, the electron blocking layer was formed only below the first light-emitting layer. However, the electron transport layer shared by all the organic EL elements was formed below the electron blocking layer. The hole blocking layer was formed only above the third light-emitting layer, and no hole blocking layer was formed above other light-emitting layers.

In this Example, electrons are concentrated at the boundary between the first light-emitting layer and the electron blocking layer and in the vicinity of the boundary and are then recombined with holes transferred from the electron blocking layer. Excitons are thereby formed, and the excitation energy is transferred to the dopant of the first light-emitting layer, so that a prescribed light-emitting color is obtained. As described above, in the first organic EL element including the first light-emitting layer, the light-emitting position is present on the lower surface of the first light-emitting layer, so that the influence of the second and third foreign material films that can be present above the upper surface of the first light-emitting layer can be reduced.

Holes are concentrated at the boundary between the third light-emitting layer and the hole blocking layer and in the vicinity of the boundary and are recombined with electrons transferred from the hole blocking layer. Excitons are thereby formed, and the excitation energy is transferred to the dopant of the third light-emitting layer, so that a prescribed light-emitting color is obtained. As described above, in the third organic EL element including the third light-emitting layer, the light-emitting position is present on the upper surface of the third light-emitting layer, so that the influence of the first and second foreign material films that can be present below the lower surface of the third light-emitting layer can be reduced.

Figure 18:
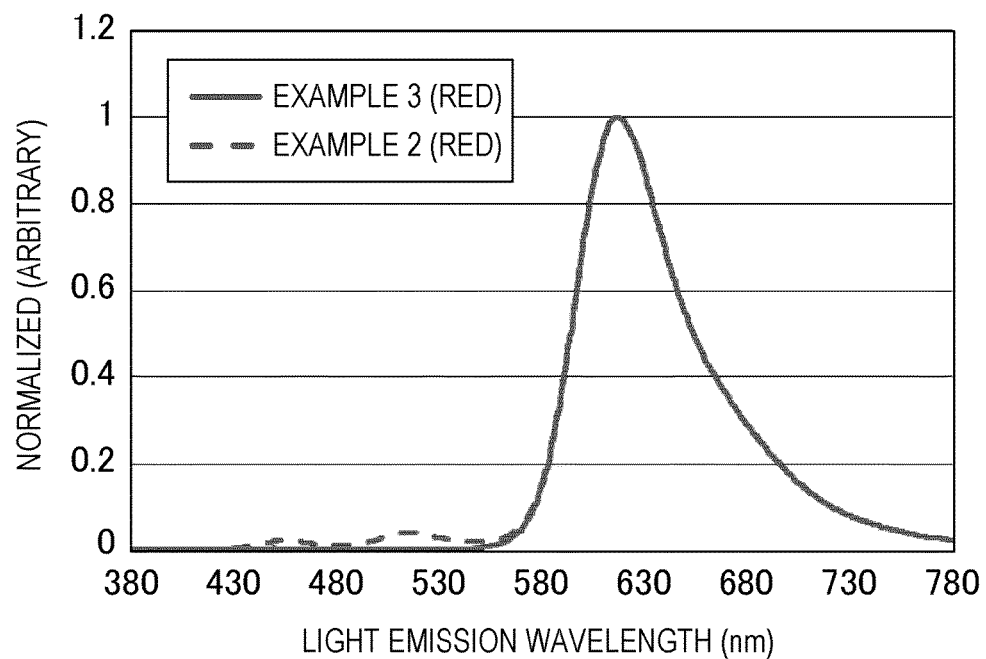
FIG. 18 shows the light emission spectra of organic EL elements included in organic EL devices in Examples 2 and 3.

FIG. 18 shows the light emission spectra of organic EL elements included in the organic EL devices in Examples 2 and 3. As shown in FIG. 18, in each of Examples 2 and 3, the first light-emitting layer includes almost no spectrum components (blue and green) other than the intended light-emitting color. The occurrence of color mixing could be prevented, and the intended light-emitting color could be obtained. These results are considered to indicate that, in Examples 2 and 3, the light-emitting layer emits light from a portion spaced apart from the upper surface of the light-emitting layer on which the first and second foreign material films can be present.

As shown in FIG. 18, the light emission spectrum of the first light-emitting layer in Example 3 is similar to that in Example 2. However, higher brightness can be obtained in Example 3 than in Example 2. This is because of the following reason. In Example 2, electrons not recombined pass through the first light-emitting layer. However, in Example 3, electrons can be blocked at the boundary between the first light-emitting layer and the electron blocking layer, so that electrons and holes can be more efficiently recombined at the boundary and in the vicinity thereof.

Figure 19:
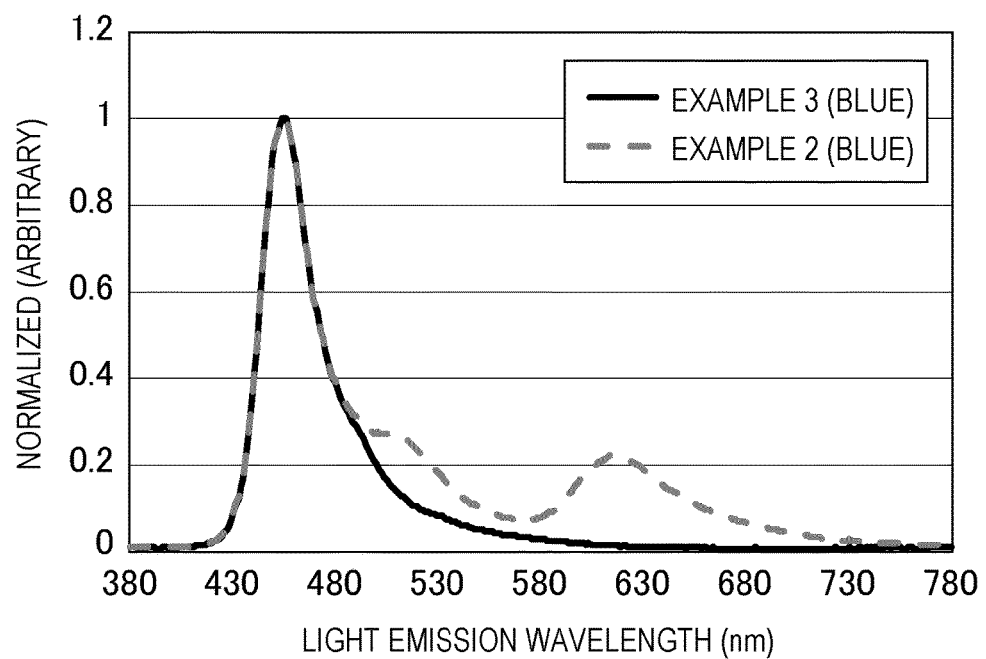
FIG. 19 shows the light emission spectra of organic EL elements included in the organic EL devices in Examples 2 and 3.

FIG. 19 shows the light emission spectra of organic EL elements included in the organic EL devices in Examples 2 and 3. As shown in FIG. 19, the third light-emitting layer in Example 2 includes spectrum components (red and blue) other than the intended light-emitting color. However, in Example 3, such components are not present. The occurrence of color mixing could be prevented, and the intended light-emitting color could be obtained. These results are considered to indicate that, in Example 3, the light-emitting layer emits light from a portion spaced apart from the lower surface of the light-emitting layer on which the first and second foreign material films can be present.

Embodiment 3

The present embodiment is substantially the same as embodiment 1 except that the material of the second light-emitting layer is different from that in embodiment 1. Therefore, in the present embodiment, features specific to the present embodiment will mainly be described, and description of the same features as in embodiment 1 will be omitted. In the present embodiment and embodiment 1, the components having the same or similar functions are denoted by the same symbols, and the description of these components will be omitted.

Figure 20:
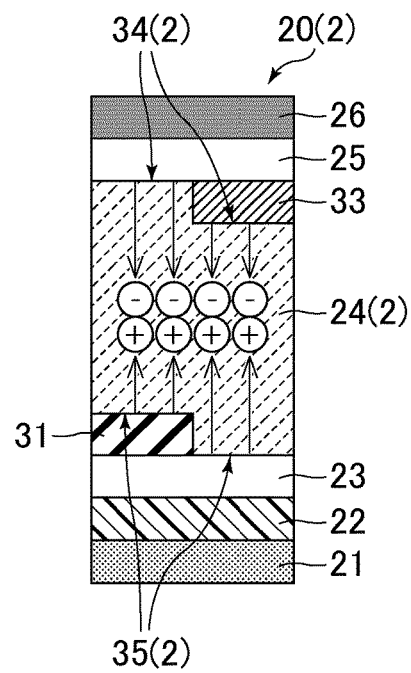
FIG. 20 is a schematic cross-sectional view of an organic EL element included in an organic EL device in embodiment 3.

FIG. 20 shows a schematic cross-sectional view of an organic EL element included in an organic EL device in embodiment 3.

As shown in FIG. 20, the second light-emitting layer 24(2) contains (1) a host material having electron transport capability, an assist material having a HOMO higher than the host material and having hole transport capability, and a dopant (a doping material, a guest material) or (2) a host material having hole transport capability, an assist material having a LUMO lower than the host material and having electron transport capability, and a dopant. The second organic EL element 20(2) including the second light-emitting layer 24(2) described above can correspond to the organic electroluminescent element VII or VIII described above.

In the case of (1) described above, the hole transport capability of the host material having electron transport capability is lower than its electron transport capability. The hole transport capability decreases as the HOMO level decreases, i.e., the difference between the HOMO level and the vacuum level increases. When an assist material having a high HOMO level is mixed into the above host material, holes are drawn into the assist material, so that the holes are easily introduced into the second light-emitting layer 24(2). In this case, the hole transport capability of the second light-emitting layer 24(2) increases, and its charge transport capability becomes close to bipolar capability. Since the host material has electron transport capability, recombination of electrons and holes is less likely to occur at the upper surface 34(2) of the second light-emitting layer 24(2) and in the vicinity thereof. Therefore, the electron-hole recombination region in the second light-emitting layer 24(2) can be located in the vicinity of the central portion of the second light-emitting layer 24(2) in the thickness direction. The light-emitting position can thereby be spaced apart from the lower surface 35(2) of the second light-emitting layer 24(2).

In the case of (2) above, the electron transport capability of the host material having hole transport capability is lower than its hole transport capability. The electron transport capability decreases as the LUMO level increases, i.e., the difference between the LUMO level and the vacuum level decreases. When an assist material having a low LUMO level is mixed into the above host material, electrons are drawn into the assist material, so that electrons are easily introduced into the second light-emitting layer 24(2). In this case, the electron transport capability of the second light-emitting layer 24(2) increases, and its charge transport capability becomes close to bipolar capability. Since the host material has hole transport capability, recombination of electrons and holes is less likely to occur at the lower surface 35(2) of the second light-emitting layer 24(2) and in the vicinity thereof. Therefore, the electron-hole recombination region in the second light-emitting layer 24(2) can be located in the vicinity of the central portion of the second light-emitting layer 24(2) in the thickness direction. The light-emitting position can thereby be spaced apart from the upper surface 34(2) of the second light-emitting layer 24(2).

As described above, even when the first and third foreign material films 31 and 33 are present below and above and below the second light-emitting layer 24(2), the second organic EL element 20(2) including the second light-emitting layer 24(2) is less likely to be influenced by these foreign material films, so that deterioration of the light-emitting color of the second organic EL element 20(2) can be prevented.

No particular limitation is imposed on the specific HOMO and LUMO levels of the host material and assist material, and the HOMO and LUMO levels may be set appropriately. For example, the HOMO level of the host material may be 5 eV to 6.5 eV, and the LUMO level of the host material may be 2 eV to 3 eV. The HOMO level of the assist material may be 5 eV to 6 eV, and the LUMO level of the assist material may be 2.5 eV to 3 eV.

No particular limitation is imposed on the ratio (composition ratio) of the host material, the assist material, and the dopant, and the ratio may be set appropriately. For example, the composition ratios of the assist material and the dopant with respect to the total thickness of the light-emitting layer containing the host material, the assist material, and the dopant may be 0.1 to 0.5 and 0.01 to 0.3, respectively.

The dopant emits light mainly when the excitation energy generated by recombination of electrons and holes in the host material or the assist material is transferred from the host material or the assist material to the dopant. Therefore, the mechanism of charge transfer is determined based on the energy levels of the host material and the assist material. Therefore, no particular limitation is imposed on the HOMO and LUMO levels of the dopant, and the HOMO and LUMO levels may be determined based on general design guidelines.

The organic EL device in the present embodiment was actually manufactured, and its characteristics were evaluated. The results are shown below.

Example 4

An organic EL device in Example 4 was produced in the same manner as in Example 1 except that the step of vapor-depositing the second light-emitting layer was different from that in Example 1.

First, the same procedure as in Example 1 was repeated until the first light-emitting layer vapor-deposition step.

Next, NS60 (manufactured by Nippon Steel Chemical Co., Ltd.) having electron transport capability was used as the host material, SD03 (manufactured by UDC) was used as the assist material, and GD48 (manufactured by UDC) was used as the dopant. These materials were co-vapor deposited on the substrate to form a 60 nm-thick light-emitting layer (green) having electron transport capability as the second light-emitting layer. A vapor deposition mask having a plurality of stripe-shaped openings was used. The concentration of the assist material was 40% of the total thickness of the light-emitting layer, and the concentration of the dopant was 20% of the total thickness of the light-emitting layer. The rate of deposition of the host material was fixed at 0.4 Å/sec, the rate of deposition of the assist material was fixed at 0.4 Å/sec, and the rate of deposition of the dopant was fixed at 0.2 Å/sec. The temperatures of the crucibles for these materials were within the range of 250° C. to 400° C. A plurality of similar experiments were performed. However, since the conditions of the experiments such as the amounts of the materials fed were different for each experiment, the temperatures of the crucibles varied within the above range for each experiment. The HOMO level of NS60 is 5.8 eV, and the HOMO level of SD03 is 5.6 eV.

Then the same procedure as in Example 1 was repeated to complete the organic EL device in this Example.

Figure 21:
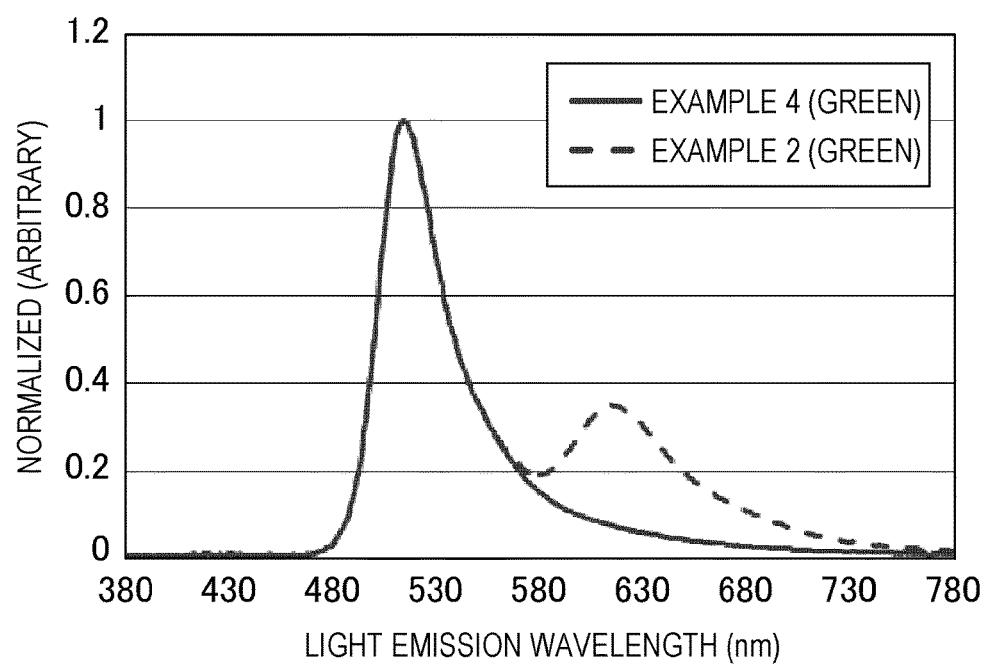
FIG. 21 shows the light emission spectra of organic EL elements included in organic EL devices in Examples 2 and 4.

FIG. 21 shows the light emission spectra of organic EL elements included in the organic EL devices in Examples 2 and 4. As shown in FIG. 21, the second light-emitting layer in Example 2 includes a spectrum component (red) other than the intended light-emitting color is present. However, in Example 4, such a component is not present. Therefore, the occurrence of color mixing could be prevented, and the intended light-emitting color could be obtained. In Example 4, the light-emitting position is considered to be present in a portion spaced apart from the upper and lower surfaces of the second light-emitting layer, and the second light-emitting layer is considered to emit light from a portion spaces apart from the upper and lower surfaces of the light-emitting layer on which the first and third foreign material films can be present.

Embodiment 4

The present embodiment is substantially the same as embodiment 1 except that the structure of the organic EL elements is turned upside down. Therefore, in the present embodiment, features specific to the present embodiment will mainly be described, and description of the same features as in embodiment 1 will be omitted. In the present embodiment and embodiment 1, the components having the same or similar functions are denoted by the same symbols, and the description of these components will be omitted.

Figure 22:
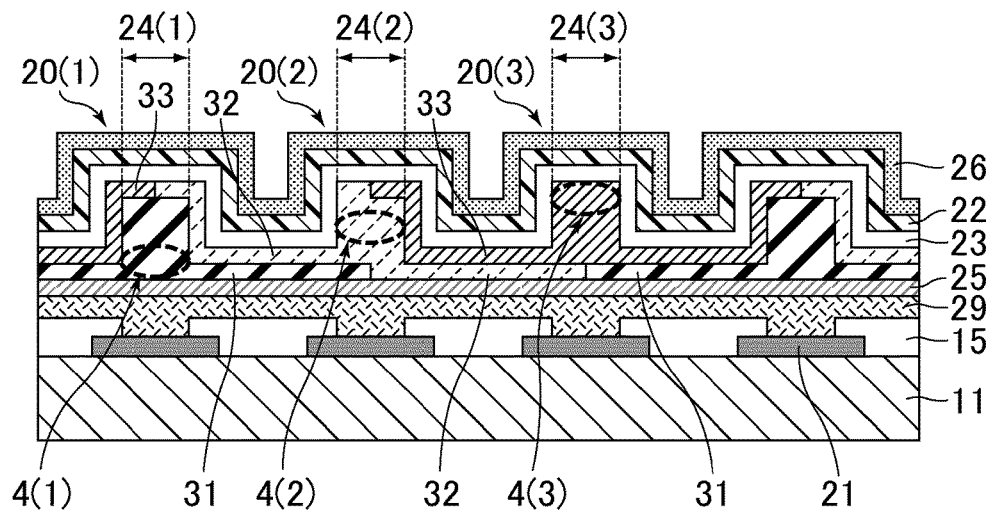
FIG. 22 is a schematic cross-sectional view of an organic EL device in embodiment 4.

FIG. 22 is a schematic cross-sectional view of an organic EL device in embodiment 4.

As shown in FIG. 22, each of the organic EL elements 20(1), 20(2), and 20(3) includes a first electrode 21, an organic EL layer, and a second electrode 26, and these are stacked in this order from the side toward the insulating substrate 11.

The first electrodes 21 function as cathodes for injecting (supplying) electrons into the organic EL layers and are connected to TFTs (not shown). The first electrodes 21 are formed within regions of their corresponding sub-pixels.

An electron injection layer 29, the electron transport layer 25, the light-emitting layer 24(1), 24(2), or 24(3), the hole transport layer 23, and the hole injection layer 22 that forms an organic EL layer are stacked between a first electrode 21 and the second electrode 26 in this order from the side toward the insulating substrate 11.

The second electrode 26 functions as an anode for injecting holes into the organic EL layer. The second electrode 26 extends continuously over the entire display area and covers the hole injection layer 22. The second electrode 26 is electrically connected to a trace (not shown).

Layers other than the light-emitting layers 24(1), 24(2), and 24(3) are not the essential layers of the organic EL layers and may be formed as needed according to the required characteristics of the first, second, and third organic EL elements 20(1), 20(2), and 20(3).

For example, any of the following layered structures (1) to (9) may be used for the first, second, and third organic EL elements.

(1) First electrode/light-emitting layer/second electrode (2) First electrode/light-emitting layer/hole transport layer/second electrode (3) First electrode/electron transport layer/light-emitting layer/second electrode (4) First electrode/electron transport layer/light-emitting layer/hole transport layer/second electrode (5) First electrode/light-emitting layer/hole transport layer/hole injection layer/second electrode (6) First electrode/electron transport layer/light-emitting layer/hole transport layer/hole injection layer/second electrode (7) First electrode/electron injection layer/electron transport layer/light-emitting layer/second electrode (8) First electrode/electron injection layer/electron transport layer/light-emitting layer/hole transport layer/second electrode (9) First electrode/electron injection layer/electron transport layer/light-emitting layer/hole transport layer/hole injection layer/second electrode The hole injection layer and the hole transport layer may be integrated together, as in embodiment 1. The electron transport layer and the electron injection layer may be integrated together.

The layered structure of the first, second, and third organic EL elements is not particularly limited those shown in (1) to (9) above, and any desired layered structure may be used according to the required characteristics.

Also in the present embodiment in which the structure of the organic EL elements in embodiment 1 is turned upside down, the occurrence of color mixing can be suppressed, and a display having high color purity and high display quality can be realized, as in embodiment 1.

In the present embodiment, no particular limitation is imposed on the specific method for controlling the light-emitting positions of the light-emitting layers, and any of the methods described in embodiment 1 to 3 can be appropriately used.

A manufacturing method for the organic EL device in the present embodiment may include the same steps as those in the manufacturing method for the organic EL device in embodiment 1, but the order of the steps of vapor deposition for the organic EL layers is the reverse of the order in embodiment 1.

The organic EL device in the present embodiment was actually manufactured, and its characteristics were evaluated. The results are shown below.

Example 5

A manufacturing method for an organic EL element in Example 5 will be described.

First, a commercial non-alkali glass substrate was washed using a known method, and then TFTs and traces were formed on the glass substrate using a known method.

Next, an inorganic insulating film was formed on the TFTs and the traces by, for example, a CVD method, and then contact holes were formed in the inorganic insulating film by well-known photolithography. Etching performed was dry etching.

Next, a commercial acrylic resin was applied to the inorganic insulating film to a thickness of 3 μm by spin coating, and the substrate coated with the resin material was pre-baked at 140° C. for 5 minutes to form a planarization film. Then a known photo-process including exposure and development was performed to form contact holes for connecting the first electrodes to the TFTs in the planarization film. Then the resultant substrate was baked using an oven at 200° C. in air for 1 hour. An interlayer insulating film including the inorganic insulating film and the planarization film was thereby formed.

Next, an IZO (indium zinc oxide) film was formed over the entire surface of the baked substrate by a sputtering method and then subjected to pattern formation by well-known photolithography.

Next, an Al (aluminum) film was formed to a thickness of 100 nm over the entire surface of the substrate having the IZO pattern formed thereon by a sputtering method and then subjected to pattern formation by well-known photolithography. First electrodes serving as cathodes were thereby formed.

Next, a commercial acrylic resin was applied to a thickness of 2 μm to the substrate having the Al pattern formed thereon, and the substrate coated with the resin was pre-baked at 140° C. for 3 minutes to form a resin film. Then a known photo-process including exposure and development was used to form openings in the resin film such that part of the first electrodes except for their circumferential edges were exposed, whereby an edge cover covering the circumferential edges of the first electrodes was formed.

Next, the substrate with the edge cover formed thereon was subjected to ultrasonic cleaning in pure water at 70° C. for 15 minutes, and then water droplets adhering to the substrate were blown off by nitrogen blowing. Then the resultant substrate was placed in an oven at 200° C. in a nitrogen atmosphere for 1 hour to remove water.

Next, the resultant substrate was placed in a high-vacuum chamber at $10^{-3}$ Pa or lower and heated at 200° C. for 1 hour for degassing.

Next, the resultant substrate was subjected to known surface modification treatment with oxygen plasma in a high-vacuum chamber of $10^{-3}$ Pa or lower.

Next, elements of the organic EL layers were formed. All the elements were formed in a high vacuum of $10^{-3}$ Pa or lower by a vacuum deposition method.

First, lithium fluoride (LiF) was vapor-deposited over the entire display area to form a 0.5 nm-thick electron injection layer in a sold pattern over the entire region containing at least the entire display area (i.e., to form a continuous hole injection layer). The rate of deposition was fixed at 0.1 Å/sec, and the temperature of a crucible was within the range of 750° C. to 800° C. A plurality of similar experiments were performed. However, since the conditions of the experiments such as the amount of the material fed were different for each experiment, the temperature of the crucible varied within the above range for each experiment.

Next, TR-E314 manufactured by TORAY INDUSTRIES Inc. was vapor-deposited over the entire display area to form a 15 nm-thick electron transport layer in a solid pattern over the entire region including at least the entire display area. The rate of deposition was fixed at 1 Å/sec, and the temperature of a crucible was within the range of 380° C. to 400° C. A plurality of similar experiments were performed. However, since the conditions of the experiments such as the amount of the material fed were different for each experiment, the temperature of the crucible varied within the above range for each experiment.

Next, a method for forming the light-emitting layers will be described. All the light-emitting layers were formed using a vapor deposition mask having a plurality of stripe-shaped openings by the same method as in Example 1.

First, diphenylamino benzodifuran (DPABDF) was used as a host material, tetrafluorotetracyanoquinodimethane (TCNQF4) was used as an acceptor, and tris(2-phenylpyridine) iridium (III) (Ir(ppy)$_3$) was used as a light-emitting dopant. These materials were co-vapor deposited on the substrate to form a 35 nm-thick light-emitting layer (blue) having hole transport capability as the first light-emitting layer. The concentration of the acceptor was 20% of the total thickness of the light-emitting layer, and the concentration of the dopant was 5% of the total thickness of the light-emitting layer. The rate of deposition of the host material was fixed at 0.8 Å/sec, the rate of deposition of the acceptor was fixed at 0.2 Å/sec, and the rate of deposition of the dopant was fixed at 0.05 Å/sec. The temperatures of the crucibles for these materials were within the range of 200° C. to 400° C. A plurality of similar experiments were performed. However, since the conditions of the experiments such as the amounts of the materials fed were different for each experiment, the temperatures of the crucibles varied within the above range for each experiment.

Next, CBP having bipolar charge transport capability was used as a host material, and Ir(ppy)$_3$ was used as a doping material. These materials were co-vapor deposited on the substrate to form a 40 nm-thick light-emitting layer (green) having bipolar charge transport capability as the second light-emitting layer. Commercial products were used for these materials. The concentration of the dopant was 5% of the total thickness of the light-emitting layer. The rate of deposition of the host material was fixed at 1 Å/sec, and the rate of deposition of the dopant was fixed at 0.05 Å/sec. The temperatures of the crucibles for these materials were within the range of 200° C. to 400° C. A plurality of similar experiments were performed. However, since the conditions of the experiments such as the amounts of the materials fed were different for each experiment, the temperatures of the crucibles varied within the above range for each experiment.

Then Alq$_3$ (tris(8-quinolinolato)aluminum) having electron transport capability was used as a host material, and DCM2 was used as a doping material. These materials were co-vapor deposited on the substrate to form a 40 nm-thick light-emitting layer (red) having electron transport capability as the third light-emitting layer. Commercial products were used for these materials. The concentration of the dopant was 5% of the total thickness of the light-emitting layer. The rate of deposition of the host material was fixed at 1 Å/sec, and the rate of deposition of the dopant was fixed at 0.05 Å/sec. The temperatures of the crucibles for these materials were within the range of 200° C. to 400° C. A plurality of similar experiments were performed. However, since the conditions of the experiments such as the amounts of the materials fed were different for each experiment, the temperatures of the crucibles varied within the above range for each experiment.

Next, NPB (N,N-di(naphthalene-1-yl)-N,N-diphenylbenzidene) was vapor-deposited over the entire display area to form a 10 nm-thick hole transport layer in a solid pattern over the entire region including at least the entire display area. The rate of deposition was fixed at 1 Å/sec, and the temperature of a crucible was within the range of 200° C. to 400° C. A plurality of similar experiments were performed. However, since the conditions of the experiments such as the amount of the material fed were different for each experiment, the temperature of the crucible varied within the above range for each experiment.

Next, LG-101 (manufactured by LG Chem, Ltd.) was vapor-deposited over the entire display area to form a 30 nm-thick hole injection layer in a solid pattern over the entire region including at least the entire display area. The rate of deposition was fixed at 1 Å/sec, and the temperature of a crucible was within the range of 350° C. to 400° C. A plurality of similar experiments were performed. However, since the conditions of the experiments such as the amount of the material fed were different for each experiment, the temperature of the crucible varied within the above range for each experiment.

Next, an ITO film used as the second electrode serving as an anode was formed to a thickness of 100 nm over the entire display area by an ion beam sputtering method. The acceleration voltage of the ion beam was 50 V to 750 V, and the ion beam current was 50 mA to 500 mA. The ion source was Kr$^+$, and the ultimate vacuum before irradiation with the ion beam was 0.01 Pa or less.

Finally, cut glass with a frame-shaped circumference portion and a sealing resin were used to seal the organic EL elements. The cut glass used was formed by chemical etching and was transparent in the display area.

In this Example, a top emission structure in which light emitted is extracted from the organic EL element-formed surface of the substrate is used. However, the organic EL device in embodiment 4 may be of the bottom emission type.

Example 6

An organic EL device in Example 6 was produced in the same manner as in Example 4 except that the first light-emitting layer, the second light-emitting layer, and the third light-emitting layer were different from those in Example 4. In Example 6, all the light-emitting layers were formed using materials having electron transport capability.

NS60 (manufactured by Nippon Steel Chemical Co., Ltd.) having electron transport capability was used as a host material, and RD26 (manufactured by UDC) was used as a dopant. These materials were co-vapor deposited on a substrate to form a 25 nm-thick light-emitting layer (red) having electron transport capability as the first light-emitting layer. The concentration of the dopant was 4% of the total thickness of the light-emitting layer. The rate of deposition of the host material was fixed at 1 Å/sec, and the rate of deposition of the dopant was fixed at 0.04 Å/sec. The temperatures of the crucibles for these materials were within the range of 250° C. to 350° C. A plurality of similar experiments were performed. However, since the conditions of the experiments such as the amounts of the materials fed were different for each experiment, the temperatures of the crucibles varied within the above range for each experiment.

Next, NS60 (manufactured by Nippon Steel Chemical Co., Ltd.) having electron transport capability was used as a host material, and GD48 (manufactured by UDC) was used as a dopant. These materials were co-vapor deposited on the substrate to form a 30 nm-thick light-emitting layer (green) having electron transport capability as the second light-emitting layer. The concentration of the dopant was 20% of the total thickness of the light-emitting layer. The rate of deposition of the host material was fixed at 0.8 Å/sec, and the rate of deposition of the dopant was fixed at 0.2 Å/sec. The temperatures of the crucibles for these materials were within the range of 250° C. to 350° C. A plurality of similar experiments were performed. However, since the conditions of the experiments such as the amounts of the materials fed were different for each experiment, the temperatures of the crucibles varied within the above range for each experiment.

BH232 (manufactured by Idemitsu Kosan Co., Ltd.) having electron transport capability was used as a host material, and BD310 (manufactured by Idemitsu Kosan Co., Ltd.) was used as a dopant. These materials were co-vapor deposited on the substrate to form a 30 nm-thick light-emitting layer (blue) having electron transport capability as the third light-emitting layer. The concentration of the dopant was 7.5% of the total thickness of the light-emitting layer. The rate of deposition of the host material was fixed at 1 Å/sec, and the rate of deposition of the dopant was fixed at 0.075 Å/sec. The temperatures of the crucibles for these materials were within the range of 250° C. to 350° C. A plurality of similar experiments were performed. However, since the conditions of the experiments such as the amounts of the materials fed were different for each experiment, the temperatures of the crucibles varied within the above range for each experiment.

Figure 23:
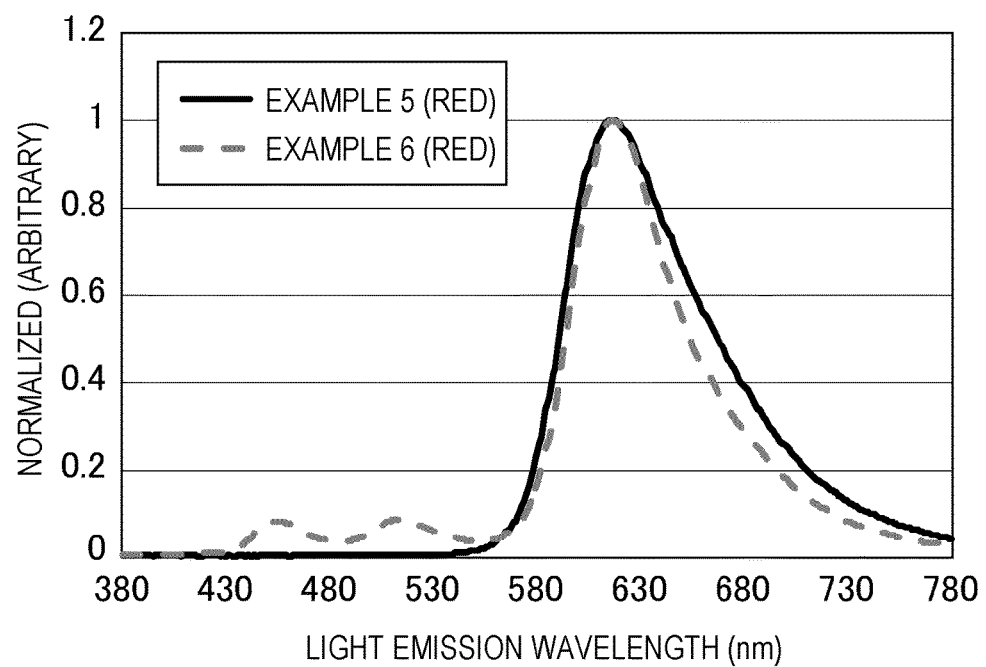
FIG. 23 shows the light emission spectra of organic EL elements included in organic EL devices in Examples 5 and 6.

FIG. 23 shows the light emission spectra of organic EL elements included in the organic EL devices in Examples 5 and 6. As shown in FIG. 23, in Example 6, the light-emitting layer (red) includes spectrum components (blue and green) other than the intended light-emitting color. However, in Example 5, no such components are present. Therefore, the occurrence of color mixing could be prevented, and the intended light-emitting color could be obtained. The above results indicate the following. In Example 6, the second and third foreign material films containing the blue and green light-emitting materials, respectively, are considered to be present above the first light-emitting layer (red). Since the first light-emitting layer (red) has electron transport capability, the light-emitting position is considered to be present in the vicinity of the upper surface of the first light-emitting layer (red). In Example 5, the light-emitting position is considered to be present at the boundary between the third light-emitting layer (red) and the hole transport layer, and the third light-emitting layer (red) is considered to emit light from a portion spaced apart from the lower surface of the third light-emitting layer (red) on which the first and second foreign material films can be present. This is because the third light-emitting layer (red) has electron transport capability.

Figure 24:
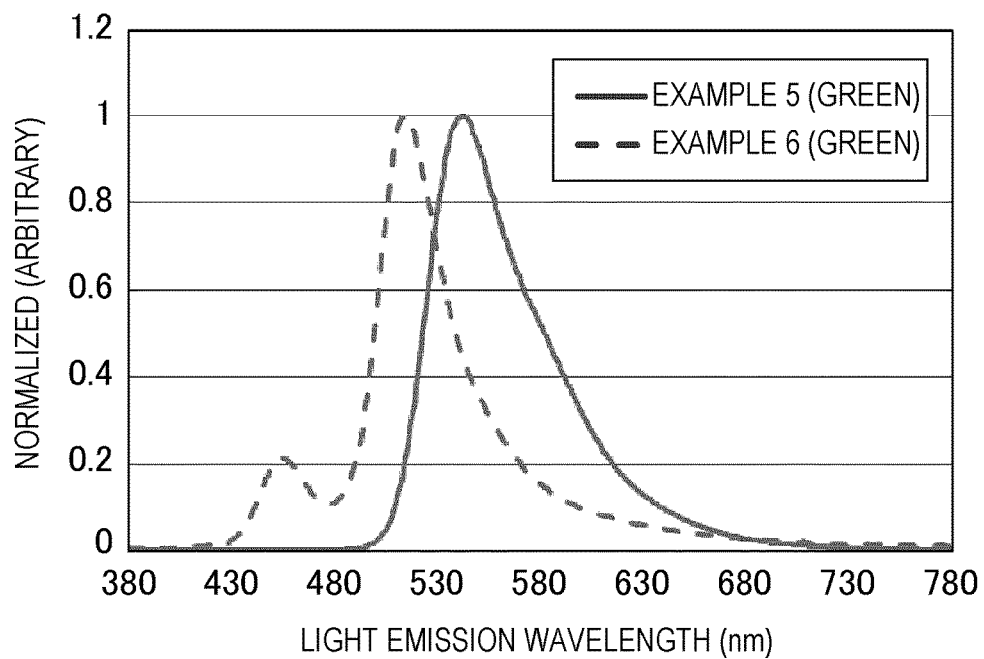
FIG. 24 shows the light emission spectra of organic EL elements included in the organic EL devices in Examples 5 and 6.

FIG. 24 shows the light emission spectra of organic EL elements included in the organic EL devices in Examples 5 and 6. As shown in FIG. 24, in Example 6, the second light-emitting layer (green) includes a spectrum component (blue) other than the intended light-emitting color. However, in Example 5, no such a component is present. Therefore, the occurrence of color mixing could be prevented, and the intended light-emitting color could be obtained. The above results indicate the following. In Example 6, the third foreign material film containing the blue light-emitting material is considered to be present above the second light-emitting layer. Since the second light-emitting layer has electron transport capability, the light-emitting position is considered to be present in the vicinity of the upper surface of the second light-emitting layer. In Example 5, the light-emitting position is considered to be present in a portion spaced apart from the upper and lower surfaces of the second light-emitting layer, and the second light-emitting layer is considered to emit light from a portion spaced apart from the upper and lower surfaces of the second light-emitting layer on which the first and third foreign material films can be present. This is because the second light-emitting layer has bipolar charge transport capability.

Figure 25:
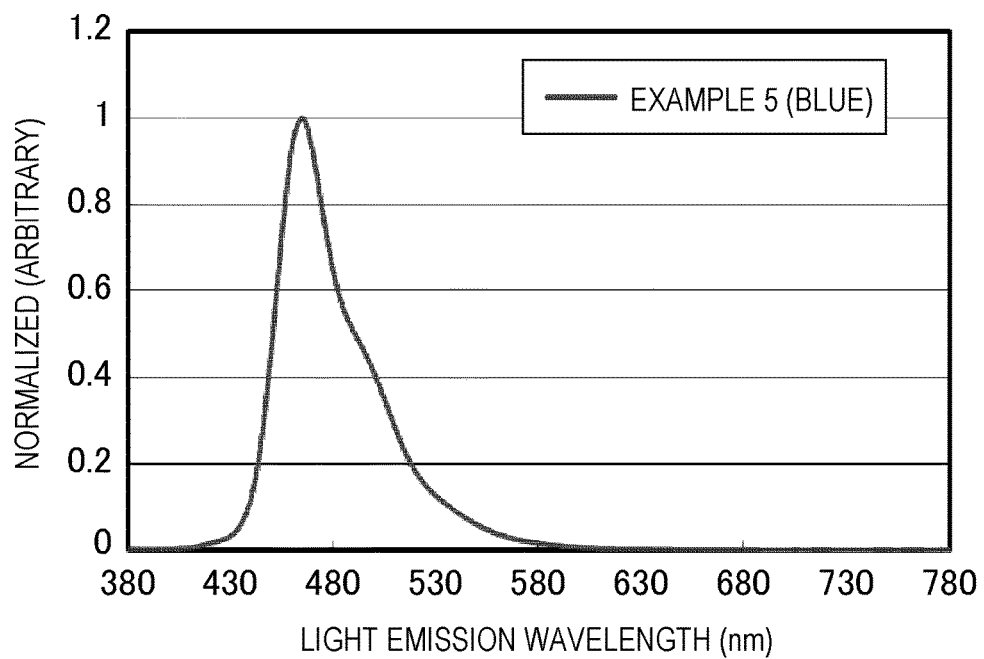
FIG. 25 shows the light emission spectrum of an organic EL element included in the organic EL device in Example 5.
Figure 26:
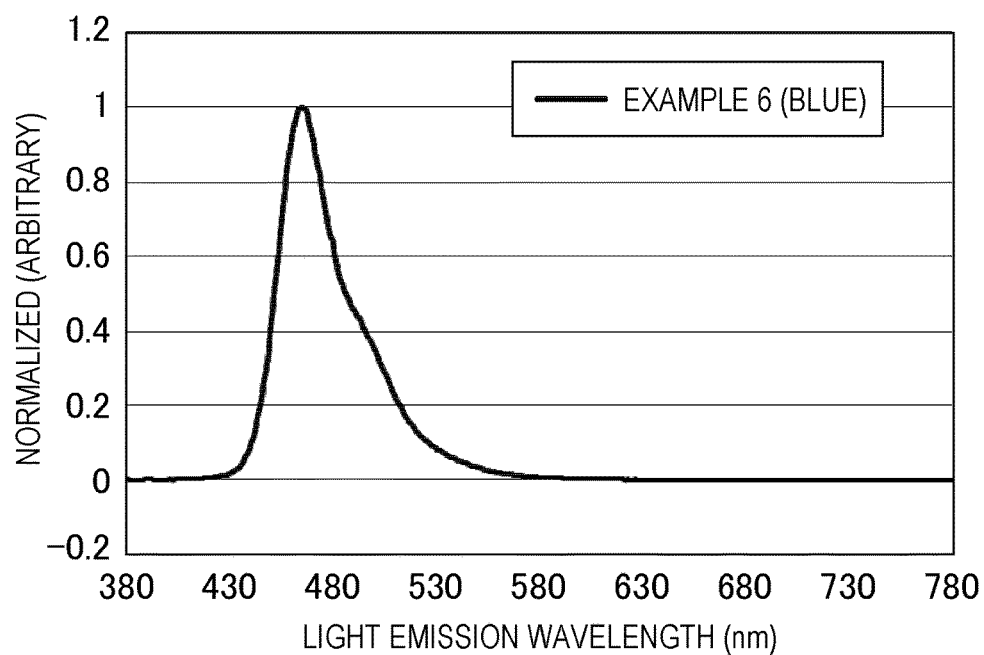
FIG. 26 shows the light emission spectrum of an organic EL element included in the organic EL device in Example 6.
Figure 27:
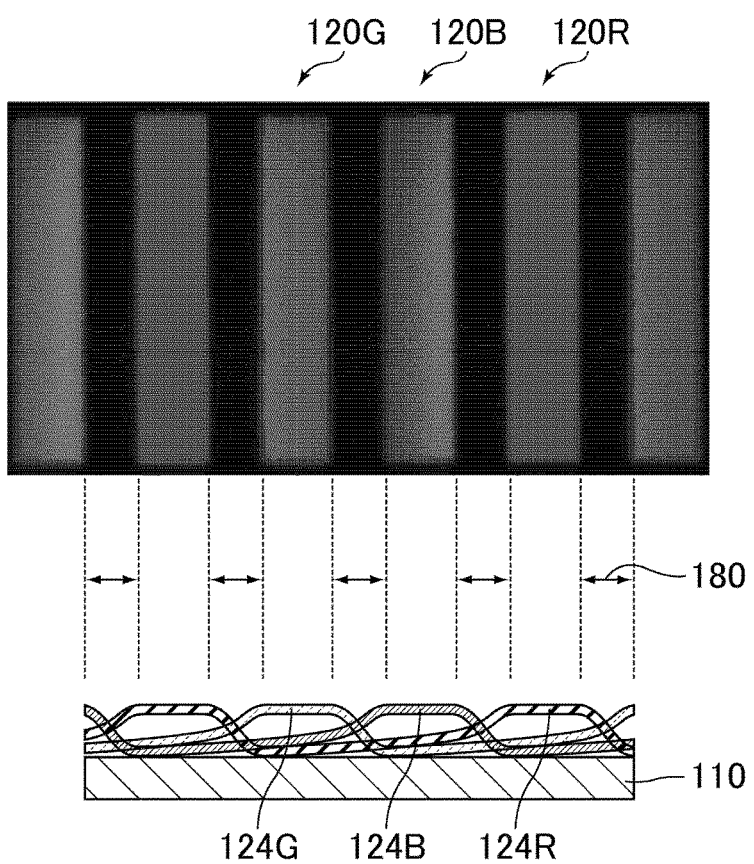
FIG. 27 The upper portion of FIG. 27 shows an enlarged photograph of an organic EL device the present inventors have studied, and the lower portion is a schematic cross-sectional view of the organic EL device shown in the upper portion.

FIGS. 25 and 26 show the light emission spectra of organic EL elements included in the organic EL devices in Examples 5 and 6, respectively.

As shown in FIGS. 25 and 26, in both Examples 5 and 6, no color mixing occurred in the light-emitting layer (blue), and the intended light-emitting color could be obtained. In Example 5, the first light-emitting layer (blue) has hole transport capability. Therefore, the light-emitting position is considered to be present at the boundary between the first light-emitting layer (blue) and the electron transport layer, and the first light-emitting layer (blue) is considered to emit light from a portion spaced apart from the upper surface of the first light-emitting layer (blue) on which the second and third foreign material films can be present. In Example 6, the third light-emitting layer (blue) has electron transport capability. Therefore, the light-emitting position is considered to be present at the boundary between the third light-emitting layer (blue) and the hole transport layer, and the third light-emitting layer (blue) is considered to emit light from a portion spaced apart from the lower surface of the third light-emitting layer (blue) on which the first and second foreign material films can be present.

In embodiments 1 to 4, the organic EL devices capable of RGB full-color display have been described. However, the number and combination of light-emitting colors are not particularly limited to RGB three colors. A color other than RGB may be included, and, for example, four colors other than three colors may be used. Specifically, four colors, e.g., RGBW (W is white) or RGBY (Y is yellow), may be used.

The application of the organic EL devices in embodiments 1 to 4 is not particularly limited to displays, and the organic EL devices may be used for lighting.

The above-described embodiments may be appropriately combined without departing from the spirit of the embodiment of the invention. Modifications of the embodiments may be combined with other embodiments.

REFERENCE SIGNS LIST

1: organic EL device
2: pixel
2R, 2G, 2B: sub-pixel
3R, 3G, 3B: light-emitting region
4(1), 4(2), 4(3): light-emitting position
10: TFT substrate
11: insulating substrate
12: TFT
13: interlayer insulating film
13a: contact hole
14: trace
15: edge cover
15R, 15G, 15B: opening
20R, 20G, 20B, 20(1), 20(2), 20(3): organic EL element
21: first electrode
22: hole injection layer
23: hole transport layer
24R, 24G, 24B, 24(1), 24(2), 24(3): light-emitting layer
25: electron transport layer
26: second electrode
27: electron blocking layer
28: hole blocking layer 31, 32, 33: film (foreign material film)
34(1), 34(2), 34(3): upper surface
35(1), 35(2), 35(3): lower surface
40: sealing member
41: sealing resin
42: sealing substrate
43: desiccant

The invention claimed is:

1. An organic electroluminescent device comprising: a substrate; and a plurality of organic electroluminescent elements disposed on the substrate;
wherein each of the plurality of organic electroluminescent elements includes a first electrode, an edge cover formed on the first electrode, and a light-emitting layer containing a light-emitting material,
wherein the edge cover has an opening, the opening exposing the first electrode other than a circumferential edge of the first electrode,
wherein the light-emitting materials are able to emit light of different colors,
wherein one of the plurality of organic electroluminescent elements includes
a first film containing the same light-emitting material as the light-emitting layer of another one of the plurality of organic electroluminescent elements, the first film being in contact with an upper surface of the light-emitting layer of the one of the plurality of organic electroluminescent elements above the opening,
wherein the one of the plurality of organic electroluminescent elements does not include a second film containing the same light-emitting material as the light-emitting layer of another one of the plurality of organic electroluminescent elements, the second film being in contact with a lower surface of the light-emitting layer of the one of the plurality of organic electroluminescent elements, and
wherein the light-emitting layer in contact with the first film emits light from a portion spaced apart from the upper surface.

2. The organic electroluminescent device according to claim 1,
wherein the one of the plurality of organic electroluminescent elements that includes the first film includes a first electrode and a second electrode,
wherein the first electrode, the light-emitting layer, the first film, and the second electrode of the one of the plurality of organic electroluminescent elements are disposed in this order, and
wherein the light-emitting layer in contact with the first film is a light-emitting layer having the capability of transporting charges of the same polarity as charges injected from the second electrode.

3. The organic electroluminescent device according to claim 1,
wherein the one of the plurality of organic electroluminescent elements that includes the first film includes a first electrode, a second electrode, and a charge blocking layer,
wherein the first electrode, the charge blocking layer, the light-emitting layer, the first film, and the second electrode of the one of the plurality of organic electroluminescent elements are disposed in this order, and
wherein the charge blocking layer blocks charges injected from the second electrode.

4. An organic electroluminescent device comprising: a substrate; and a plurality of organic electroluminescent elements disposed on the substrate;
wherein each of the plurality of organic electroluminescent elements includes a first electrode, an edge cover formed on the first electrode, and a light-emitting layer containing a light-emitting material,
wherein the edge cover has an opening, the opening exposing the first electrode other than a circumferential edge of the first electrode,
wherein the light-emitting materials are able to emit light of different colors,
wherein one of the plurality of organic electroluminescent elements includes
a first film containing the same light-emitting material as the light-emitting layer of another one of the plurality of organic electroluminescent elements, the first film being in contact with an upper surface of the light-emitting layer of the one of the plurality of organic electroluminescent elements above the opening, and
a second film containing the same light-emitting material as the light-emitting layer of another one of the plurality of organic electroluminescent elements, the second film being in contact with a lower surface of the light-emitting layer of the one of the plurality of organic electroluminescent elements above the opening, and
wherein the light-emitting layer in contact with the first film and the second film emits light from a portion spaced apart from the upper surface and the lower surface.

5. The organic electroluminescent device according to claim 4,
wherein the light-emitting material contained in the first film is different from the light-emitting material contained in the second film.

6. The organic electroluminescent device according to claim 4,
wherein the light-emitting layer in contact with the first film and the second film is a light-emitting layer having bipolar charge transport capability.

7. The organic electroluminescent device according to claim 4,
wherein the light-emitting material of the light-emitting layer in contact with the first film and the second film contains a host material having electron transport capability and an assist material having hole transport capability, and
a HOMO level of the assist material is higher than a HOMO level of the host material.

8. The organic electroluminescent device according to claim 4,
wherein the light-emitting material of the light-emitting layer in contact with the first film and the second film contains a host material having hole transport capability and an assist material having electron transport capability, and
a LUMO level of the assist material is lower than a LUMO level of the host material.

9. An organic electroluminescent device comprising: a substrate; and a plurality of organic electroluminescent elements disposed on the substrate;
wherein each of the plurality of organic electroluminescent elements includes a first electrode, an edge cover formed on the first electrode, and a light-emitting layer containing a light-emitting material,
wherein the edge cover has an opening, the opening exposing the first electrode other than a circumferential edge of the first electrode, wherein the light-emitting materials are able to emit light of different colors, wherein one of the plurality of organic electroluminescent elements includes a first film containing the same light-emitting material as the light-emitting layer of another one of the plurality of organic electroluminescent elements, the first film being in contact with a lower surface of the light-emitting layer of the one of the plurality of organic electroluminescent elements above the opening, wherein the one of the plurality of organic electroluminescent elements does not include a second film containing the same light-emitting material as the light-emitting layer of another one of the plurality of organic electroluminescent elements, the second film being in contact with an upper surface of the light-emitting layer of the one of the plurality of organic electroluminescent elements, and wherein the light-emitting layer in contact with the first film emits light from a portion spaced apart from the lower surface.

10. The organic electroluminescent device according to claim 9, wherein the one of the plurality of organic electroluminescent elements that includes the first film includes a first electrode and a second electrode, wherein the first electrode, the first film, the light-emitting layer, and the second electrode of the one of the plurality of organic electroluminescent elements are disposed in this order, and wherein the light-emitting layer in contact with the first film is a light-emitting layer having the capability of transporting charges of the same polarity as charges injected from the first electrode.

11. The organic electroluminescent device according to claim 9, wherein the one of the plurality of organic electroluminescent elements that includes the first film includes a first electrode, a second electrode, and a charge blocking layer, wherein the first electrode, the first film, the light-emitting layer, the charge blocking layer, and the second electrode of the one of the plurality of organic electroluminescent elements are disposed in this order, and wherein the charge blocking layer blocks charges injected from the first electrode.

12. A manufacturing method for the organic electroluminescent device according to claim 1, the manufacturing method comprising a light-emitting layer vapor-deposition step of forming the light-emitting layers sequentially, wherein, among the light-emitting layers, a light-emitting layer formed first emits light from a portion spaced apart from an upper surface of the light-emitting layer formed first.

13. A manufacturing method for the organic electroluminescent device according to claim 4, the manufacturing method comprising a light-emitting layer vapor-deposition step of forming the light-emitting layers sequentially, wherein, among the light-emitting layers, a light-emitting layer other than a light-emitting layer formed first or last emits light from a portion spaced apart from an upper surface and a lower surface of the light-emitting layer other than the light-emitting layer formed first or last.

14. A manufacturing method for the organic electroluminescent device according to claim 9, the manufacturing method comprising a light-emitting layer vapor-deposition step of forming the light-emitting layers sequentially, wherein, among the light-emitting layers, a light-emitting layer formed last emits light from a portion spaced apart from a lower surface of the light-emitting layer formed last.

15. The organic electroluminescent device according to claim 1, wherein the second film is in contact with the upper surface above the opening, wherein the light-emitting layer in contact with the first film and the second film emits light from a portion from a lower surface of the light-emitting layer.

16. The organic electroluminescent device according to claim 9, wherein the second film is in contact with the lower surface above the opening, wherein the light-emitting layer in contact with the first film and the second film emits light from a portion from a upper surface of the light-emitting layer.

17. The manufacturing method according claim 12, wherein the manufacturing method uses a vapor deposition mask and an evaporation source, wherein the vapor deposition mask is smaller in size than the substrate, wherein the light-emitting layer vapor-deposition step is performed over the entire substrate while the substrate is moved relative to the mask and an evaporation source with a prescribed gap provided between the substrate and the vapor deposition mask.

18. The manufacturing method according claim 13, wherein the manufacturing method uses a vapor deposition mask and an evaporation source, wherein the vapor deposition mask is smaller in size than the substrate, wherein the light-emitting layer vapor-deposition step is performed over the entire substrate while the substrate is moved relative to the mask and an evaporation source with a prescribed gap provided between the substrate and the vapor deposition mask.

19. The manufacturing method according claim 14, wherein the manufacturing method uses a vapor deposition mask and an evaporation source, wherein the vapor deposition mask is smaller in size than the substrate, wherein the light-emitting layer vapor-deposition step is performed over the entire substrate while the substrate is moved relative to the mask and an evaporation source with a prescribed gap provided between the substrate and the vapor deposition mask.

* * * * *